United States Patent
Pandev et al.

(10) Patent No.: US 10,935,893 B2
(45) Date of Patent: Mar. 2, 2021

(54) DIFFERENTIAL METHODS AND APPARATUS FOR METROLOGY OF SEMICONDUCTOR TARGETS

(71) Applicant: KLA-Tencor Corporation, Milpitas, CA (US)

(72) Inventors: Stilian Ivanov Pandev, Santa Clara, CA (US); Andrei V. Shchegrov, Campbell, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 971 days.

(21) Appl. No.: 14/453,440

(22) Filed: Aug. 6, 2014

(65) Prior Publication Data

US 2015/0046118 A1   Feb. 12, 2015

Related U.S. Application Data

(60) Provisional application No. 61/864,573, filed on Aug. 11, 2013.

(51) Int. Cl.
*G03F 7/20* (2006.01)
*H01L 21/66* (2006.01)
*G01N 21/956* (2006.01)

(52) U.S. Cl.
CPC ...... *G03F 7/70641* (2013.01); *G03F 7/70625* (2013.01); *H01L 22/12* (2013.01); *H01L 22/30* (2013.01); *G01N 21/956* (2013.01)

(58) Field of Classification Search
CPC ........... G01N 21/9501; G01N 2201/12; G01N 21/956; G01B 11/24; G01B 11/02;
(Continued)

(56) References Cited

U.S. PATENT DOCUMENTS 6,673,638 B1   1/2004  Bendik
7,034,930 B1 *  4/2006  Subramanian ..... G01N 21/9501
                                                     356/237.2
(Continued)

FOREIGN PATENT DOCUMENTS

CN    102520594 A    6/2012
EP     1721218 A1   11/2006
(Continued)

OTHER PUBLICATIONS

Jolliffe, Principal Component Analysis, 2002, Springer, 2nd Edition, pp. v-486.*
(Continued)

*Primary Examiner* — Lisa E Peters
(74) *Attorney, Agent, or Firm* — Kwan & Olynick LLP

(57) ABSTRACT

Disclosed are apparatus and methods for determining process or structure parameters for semiconductor structures. A plurality of optical signals is acquired from one or more targets located in a plurality of fields on a semiconductor wafer. The fields are associated with different process parameters for fabricating the one or more targets, and the acquired optical signals contain information regarding a parameter of interest (POI) for a top structure and information regarding one or more underlayer parameters for one or more underlayers formed below such top structure. A feature extraction model is generated to extract a plurality of feature signals from such acquired optical signals so that the feature signals contain information for the POI and exclude information for the underlayer parameters. A POI value for each top structure of each field is determined based on the feature signals extracted by the feature extraction model.

22 Claims, 14 Drawing Sheets

(58) Field of Classification Search
CPC ............ G03F 7/70616; G03F 7/70625; G03F 7/70633; G03F 9/7088; G03F 9/7092; G03F 7/70641; H01L 22/12; H01L 22/30
See application file for complete search history.

(56) References Cited

U.S. PATENT DOCUMENTS

| | | | |
|---|---|---|---|
| 7,076,320 B1* | 7/2006 | Phan | G03F 7/70525 356/394 |
| 7,110,099 B2 | 9/2006 | Littau | |
| 7,119,893 B2 | 10/2006 | Littau et al. | |
| 7,352,453 B2 | 4/2008 | Mieher et al. | |
| 7,382,447 B2 | 6/2008 | Mieher et al. | |
| 9,188,974 B1* | 11/2015 | Mack | G03F 7/70525 |
| 9,383,661 B2* | 7/2016 | Pandev | G03F 9/7026 |
| 2002/0033450 A1* | 3/2002 | Finarov | G01N 21/956 250/307 |
| 2003/0095267 A1 | 5/2003 | Mieher et al. | |
| 2004/0018653 A1 | 1/2004 | Johnson et al. | |
| 2004/0149883 A1 | 8/2004 | Eda | |
| 2004/0190008 A1 | 9/2004 | Mieher et al. | |
| 2004/0233445 A1* | 11/2004 | Littau | G01N 21/4788 356/401 |
| 2005/0099190 A1* | 5/2005 | Li | G01N 21/55 324/754.22 |
| 2006/0050283 A1* | 3/2006 | Hill | G03F 7/70625 356/512 |
| 2007/0146668 A1 | 6/2007 | Geh et al. | |
| 2007/0185684 A1 | 8/2007 | Vuong et al. | |
| 2007/0237383 A1* | 10/2007 | Funk | G03F 7/70525 382/144 |
| 2007/0288219 A1* | 12/2007 | Zafar | G03F 1/84 703/14 |
| 2008/0192221 A1 | 8/2008 | Mieher et al. | |
| 2008/0265159 A1 | 10/2008 | Hatakeyama et al. | |
| 2009/0125868 A1* | 5/2009 | Mukherjee | G03F 1/36 716/53 |
| 2009/0153818 A1* | 6/2009 | Chauhan | G03B 27/42 355/53 |
| 2009/0157577 A1* | 6/2009 | Chauhan | G03F 7/705 706/16 |
| 2009/0323037 A1 | 12/2009 | Aarts et al. | |
| 2011/0085176 A1 | 4/2011 | Cramer et al. | |
| 2011/0239167 A1* | 9/2011 | Rathsack | G03F 7/705 716/50 |
| 2011/0295555 A1* | 12/2011 | Meessen | G03F 7/705 702/179 |
| 2012/0053723 A1* | 3/2012 | Richter | H01L 22/12 700/110 |
| 2012/0062863 A1* | 3/2012 | Bijnen | G01D 5/344 355/67 |
| 2012/0086940 A1 | 4/2012 | Shih et al. | |
| 2012/0094400 A1 | 4/2012 | Adel et al. | |
| 2012/0123581 A1* | 5/2012 | Smilde | G03F 7/70483 356/445 |
| 2013/0050668 A1 | 2/2013 | Kisteman et al. | |
| 2013/0182263 A1* | 7/2013 | Shchegrov | G01B 9/02 356/512 |
| 2013/0205263 A1* | 8/2013 | Lan | G06F 17/5009 716/52 |
| 2013/0293890 A1* | 11/2013 | Amir | G01B 11/14 356/401 |
| 2013/0321810 A1* | 12/2013 | Wang | G01N 21/211 356/369 |
| 2014/0268122 A1* | 9/2014 | Matsumoto | G01N 21/956 356/237.6 |
| 2014/0297211 A1* | 10/2014 | Pandev | G03F 7/70558 702/81 |
| 2014/0316730 A1* | 10/2014 | Shchegrov | H01L 22/12 702/81 |
| 2015/0042984 A1 | 2/2015 | Pandev | |
| 2015/0046118 A1* | 2/2015 | Pandev | H01L 22/12 702/155 |
| 2015/0176985 A1* | 6/2015 | Shchegrov | H01L 22/12 356/614 |
| 2016/0282731 A1 | 9/2016 | Pandev | |

FOREIGN PATENT DOCUMENTS

| | | |
|---|---|---|
| EP | 1721218 B1 | 4/2012 |
| EP | 2515168 A2 | 10/2012 |
| JP | 2009528674 A | 8/2009 |
| KR | 20060071610 A | 6/2006 |
| WO | 2005081069 A1 | 9/2005 |

OTHER PUBLICATIONS

Ko et al, Wafer-to-Wafer Process Fault Detection Using Data Stream Mining Techniques, International Journal of Precision Engineering and Manufacturing vol. 14, No. 1, pp. 103-113 (Year: 2013).*

Pandev, Stilian I. et al., "Statistical Model-Based Metrology", U.S. Appl. No. 14/223,045, filed Mar. 24, 2014, 51 pgs.

"EPO Search Report Appl. No. 14836663.6—PCTUS2014050595", dated Apr. 26, 2017, 6 pages.

"U.S. Appl. No. 14/451,320, Examiner Interview Summary dated Mar. 11, 2016", 1 pg.

"U.S. Appl. No. 14/451,320, Non Final Office Action dated Aug. 17, 2015", 10 pgs.

"U.S. Appl. No. 14/451,320, Notice of Allowance dated Mar. 11, 2016", 9 pgs.

"European Application Serial No. 14836059.7, Search Report and Opinion dated Feb. 22, 1927", 8 pgs.

"International Application Serial No. PCT/US2014/050390, Search Report and Written Opinion dated Nov. 21, 2014", 10 pgs.

"International Application Serial No. PCT/US2014/050595, Search Report and Written Opinion dated Nov. 21, 2014", 9 pgs.

"U.S. Appl. No. 15/177,285, Final Office Action dated Aug. 24, 2017", 15 pgs.

"CN Office Action", Application No. 201480053871.8, Filing Date Aug. 8, 2014, KLA-Tencor Corp., 15 pages.

"CN Office Action", CN Office Action, Application No. 2014800548940, filing date Aug. 11, 2014, Applicant KLA-Tencor Corporation, 9 pages.

U.S. Appl. No. 15/177,285—Non Final Office Action dated Mar. 8, 2018. 9 Pages.

CN International Search Report from Chinese Office Action for Application Serial No. 103127511, filed Aug. 11, 2014. 31 pages.

* cited by examiner

DIFFERENTIAL METHODS AND APPARATUS FOR METROLOGY OF SEMICONDUCTOR TARGETS

CROSS-REFERENCE TO RELATED APPLICATIONS

This application claims the benefit of prior application U.S. Provisional Application No. 61/864,573, filed 11 Aug. 2013 by Stilian Ivanov Pandev et al., which application is herein incorporated by reference in its entirety for all purposes.

TECHNICAL FIELD OF THE INVENTION

The present invention relates generally to methods and systems for determination of process or structure parameters and, more specifically, to determination of process or structure parameters using design of experiment (DOE) or focus exposure matrix (FEM) wafers.

BACKGROUND

Photolithography or optical lithography systems used in the manufacture of integrated circuits have been around for some time. Such systems have proven extremely effective in the precise manufacturing and formation of very small details in the product. In most photolithography systems, a circuit image is written on a substrate by transferring a pattern via a light or radiation beam (e.g., UV or ultraviolet light). For example, the lithography system may include a light or radiation source that projects a circuit image through a reticle and onto a silicon wafer coated with a material sensitive to irradiation, e.g., photoresist. The exposed photoresist typically forms a pattern that after development masks the layers of the wafer during subsequent processing steps, as for example deposition and/or etching.

Two example process parameters for controlling the photolithographic process are focus and exposure (also referred to as "dose"). Focus generally deals with clarity with which an optical subsystem of the lithography system renders an image, and exposure generally deals with the amount or dosage of light (or radiation) that is used to form the pattern (such as the light produced by a light source of the lithography system). Both affect the circuit pattern in a non-trivial way. For example, changes in focus and exposure may cause changes in the resist profile and the shape of the circuit printed in the photoresist.

Different structure types often have different process windows for controlling lithography focus and exposure settings at which such structures can be formed without defects. The intersection of these windows for the different structures can be defined as an optimal range of focus and exposure settings or window.

Presently, optimal focus and exposure settings of the lithography system are determined using a focus exposure matrix (FEM) to expose a wafer with multiple combinations of focus and exposure and then inspecting the resultant pattern for the best resist profiles—the resist profiles that more closely match the desired or optimal resist profiles. The inspection is generally performed by a CD scanning electron microscope (CD-SEM) that measures various parameters of the resist profile, such as CD. In most cases, the wafer has to be destroyed, e.g., cut through, so that these parameters can be measured. The process window is generally defined as the region of focus and exposure that keeps the final resist profile within prescribed specifications (e.g., process window typically includes the optimum focus and exposure). However, CD-SEM techniques for determining an optimum process window are often time consuming, unreliable, and unable to measure certain a sidewall resist profile.

Additionally, as IC structure size continues to shrink and the process window margins also shrink, it becomes challenging to maintain structure uniformity during production. Several factors in manufacturing, including lithography cell exposure sequence perturbations convoluted with reticle enhancement features, contribute to feature response that varies across the exposure field in unexpected and often unpredictable ways.

In view of the foregoing, improved techniques for determining and monitoring optimal focus and exposure settings of a photolithographic system are desired. Improved techniques for determining any suitable process or structure parameters are also desired.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a method of determining process or structure parameters for semiconductor structures is disclosed. A plurality of optical signals is acquired from one or more targets located in a plurality of fields on a semiconductor wafer. The fields are associated with different process parameters for fabricating the one or more targets, and the acquired optical signals contain information regarding a parameter of interest (POI) for a top structure and information regarding one or more underlayer parameters for one or more underlayers formed below such top structure. A feature extraction model is generated to extract a plurality of feature signals from such acquired optical signals so that the feature signals contain information for the POI and exclude information for the underlayer parameters. A POI value for each top structure of each field is determined based on the feature signals extracted by the feature extraction model.

In a specific implementation, generating the feature extraction model includes performing a dataset reduction technique on the acquired optical signals to produce transformed optical signals data and generating the feature extraction model to extract the feature signals from the transformed optical signals data. In a further aspect, the transformed optical signals data is a linear combination of the acquired optical signals. In another aspect, the dataset reduction technique is accomplished using a principal component analysis (PCA), kernel PCA (kPCA), non-lineary PCA (NLPCA), Independent Component Analysis (ICA), or Local Linear Embedding (LLE) algorithm. In yet another embodiment, the dataset reduction technique is accomplished using a principal component analysis (PCA) technique and the transformed optical signals represent the acquired optical signals with respect to a first principal component resulting from the PCA technique.

In an alternative implementation, determining the POI is accomplished by training a parameter model to determine the POI value for each top structure based on the feature signals, and the method further includes (i) acquiring a plurality of optical signals from a plurality of unknown structures on one or more subsequent wafers and (ii) using the feature extraction model and the parameter model to determine a plurality of POI values for the unknown structures.

In one aspect, the acquired optical signals include a first set of acquired signals from one or more first targets in each field and a second set of acquired signals from one or more second target in each field, and the feature extraction model predicts each of the first acquired signals as a function of the second acquired signals with a residual signal. In one aspect, the one or more first targets have a top layer structure and an underlayer structure and the one or more second targets have the same underlayer structure as the one or more first targets but excludes the top layer structure of the one or more first targets. In this aspect, the residual signals determined for the first acquired signals are defined as the feature signals. In another aspect, the one or more first targets have a top layer structure and an underlayer structure and the one or more second targets have the same top layer structure as the one or more first targets but a different underlayer than the one or more first targets. In this aspect, the function of the second acquired signals determined for the first acquired signals is defined as the feature signals.

In another embodiment, the acquired optical signals include a first set of acquired signals at a first azimuth angle from a particular target in each field and a second set of acquired signals at a second azimuth angle from the particular target in each field, and the particular target has an unpatterned underlayer portion over which the top structure is formed. The first azimuth angle differs from the second azimuth angle, and the feature extraction model predicts each of the first acquired signals as a function of the second acquired signals with a residual signal. The residual signals determined for the first acquired signals are defined as the feature signals. In a specific example, tthe first azimuth angle is zero and the second azimuth angle is 90°. In another embodiment, the acquired optical signals include a plurality of two-dimensional beam profile reflectometry (2DBPR) images from a particular target in each field, and the particular target has an unpatterned underlayer over which the top structure is formed. In this embodiment, the feature extraction model is a radial symmetric function that fits each 2DBPR image with a residual signal, and the residual signals determined for the images are defined as the feature signals.

In another embodiment, the optical signals are acquired using one or more of the following: spectroscopic ellipsometry, Mueller matrix spectroscopic ellipsometry, spectroscopic reflectometry, spectroscopic scatterometry, beam profile reflectometry, beam profile ellipsometry, a single wavelength, a single discrete wavelength range, or multiple discrete wavelength ranges.

In an alternative embodiment, the invention pertains to a system for inspecting or measuring a specimen. This system comprises an illuminator for generating illumination and illumination optics for directing the illumination towards a particular target located in a plurality of fields on a semiconductor wafer. The fields were formed using different process parameters, including different focus values. The system also includes collection optics for directing a plurality of optical signals from the particular target located in the plurality of fields in response to the illumination to a detector system and the detector sensor for acquiring the plurality of optical signals from the particular target from the plurality of fields in response to the illumination. The system further includes a processor and memory configured for performing any of the above described operations. In a specific implementation, the system is in the form of an elipsometer and includes a polarization state generator for producing a polarized state in the illumination and a polarization state analyzer for analyzing a polarized state of the optical signals. In other embodiments, the system is in the form of a spectroscopic ellipsometer, Mueller matrix spectroscopic ellipsometer, spectroscopic reflectometer, spectroscopic scatterometer, beam profile reflectometer, or beam profile ellipsometer.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

INTRODUCTION

Figure 1:
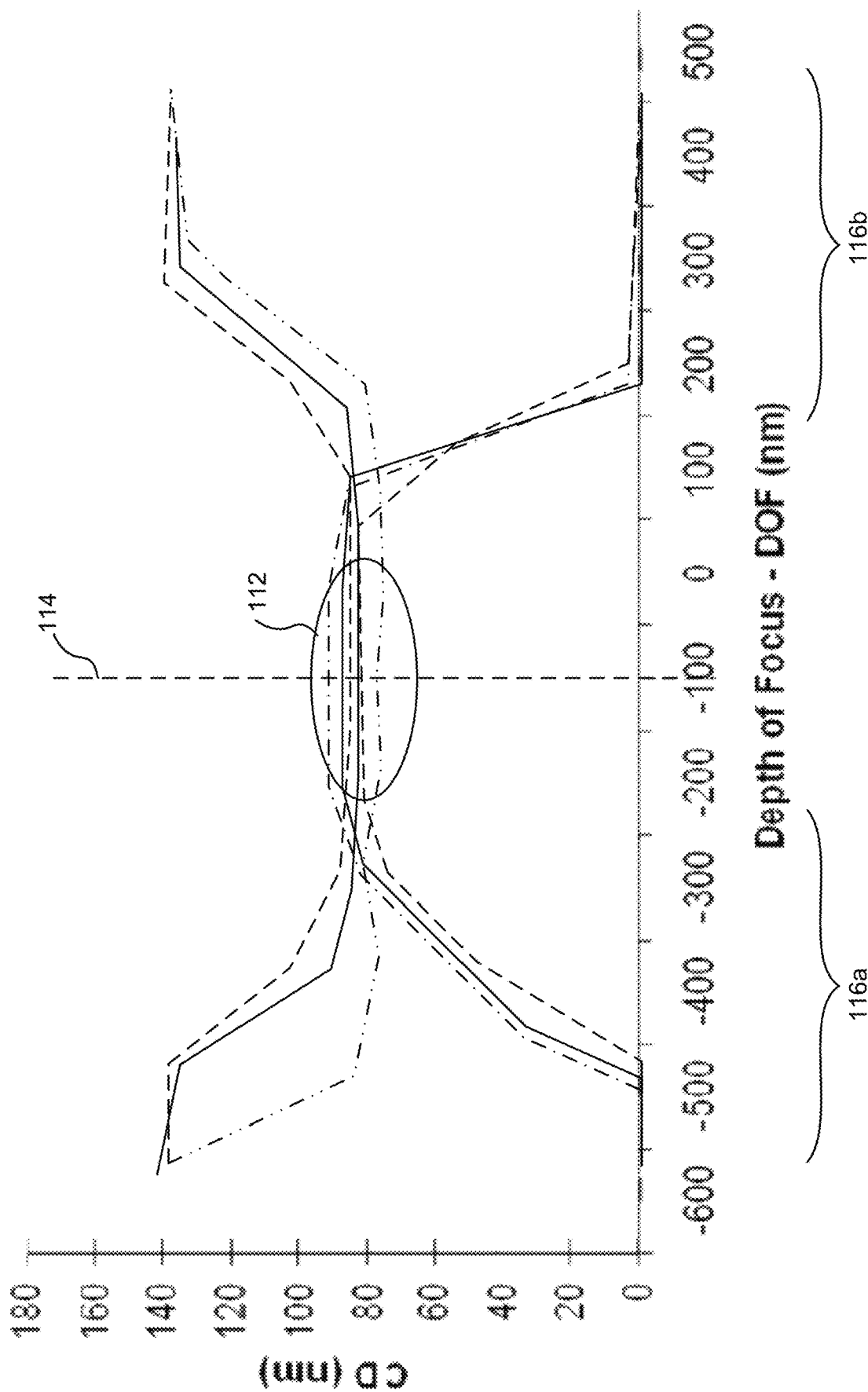
FIG. 1 illustrates an example Bossung Plot for CD as a function of focus for varying values of exposure.

A focus-exposure matrix obtained from a FEM wafer, by way of example, may be visualized using a Bossung Plot to facilitate determination of a lithography process window. The Bossung Plot generally plots CD vs. focus position for varying levels of exposure, such as the example in FIG. 1. As shown, varying levels of exposure are plotted as contour lines with CD representing the Y axis and focus position representing the X axis of the graph. A depth of focus (DOF) value of zero corresponds to a plane of focus at the top of the resist, while negative or positive DOF values result in plane of focus that is at a lower or higher level, respectively, with respect to the resist surface.

The process window is generally defined as the region of focus and exposure (e.g., 112) that keeps the final resist profile within predefined specifications. For instance, CD remains at a stable range of acceptable values (or predefined CD limits) for a specific range of DOF values and exposure doses. CD changes drastically (e.g., increases or decreases for particular exposure curves) for focus ranges 116a and 116b. An optimum focus 114 can be defined as the center of symmetry (COS) of the process window 112 for a tolerable range of exposures or dose settings.

Figure 2:
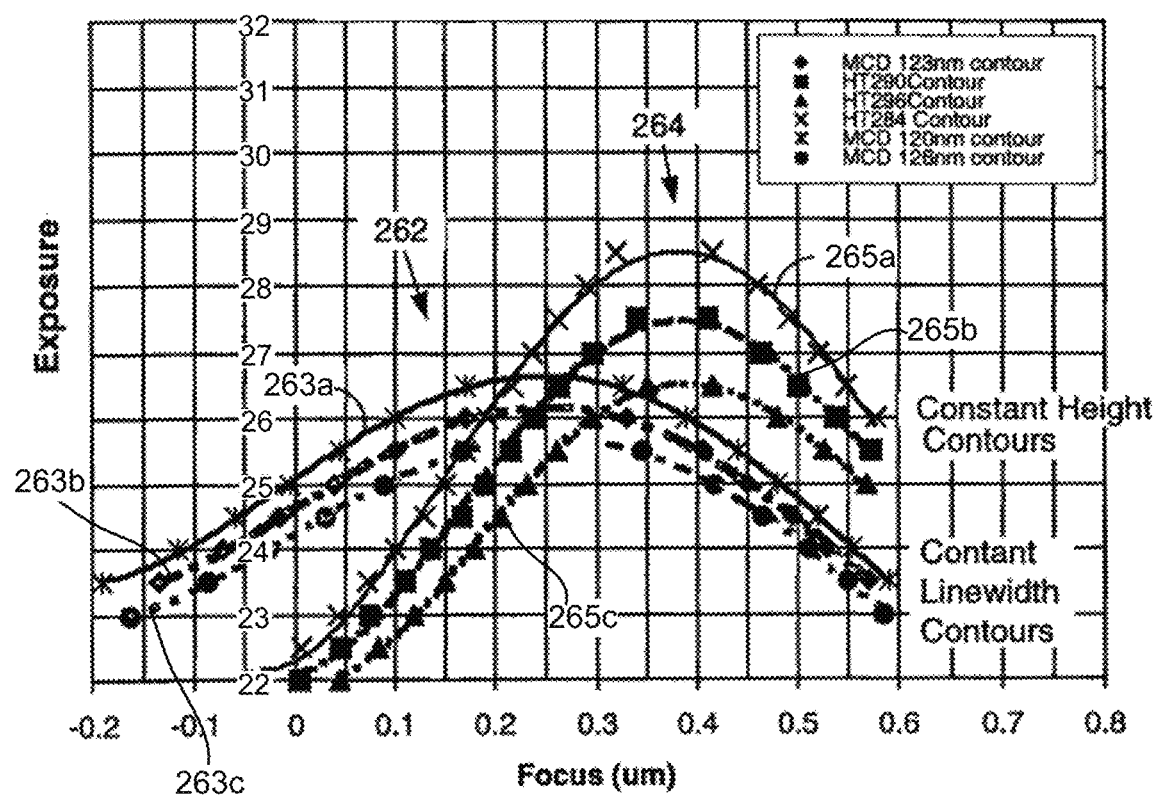
FIG. 2 illustrates a second example of a Bossung Plot for exposure vs. focus for varying values of CD.

Alternatively, the Bossung Plot may plot exposure vs. focus for varying values of CD, e.g., the values of CD are plotted as contour lines with exposure representing the Y axis and focus position representing the X axis of the graph as shown in FIG. 2. The overlapped Bossung Plots include a first Bossung Plot 262 and a second Bossung Plot 264. The overlapped Bossung plots each include three contours 265a~c of different constant line heights and three contours 263a~c of different constant line widths for a line space grating. Each curve represents either a line width or height. For instance, the three line width curves 263a~c correspond to constant line widths 120 nm, 123 nm, and 126 nm, respectively, and the three height curves 265a~c correspond to constant heights 284 nm, 290 nm, and 296 nm, respectively. As shown, a pair of specific contours of line height and line width intersects at only one focus-exposure combination, demonstrating a unique simultaneous solution for both focus and exposure. If the line width was determined to be 123 nm (curve 263b), and the height was determined to be 284 nm (curve 265a), then the optimal exposure would be approximately equal to 26 units and the optimal focus would be approximately equal to 0.2 um.

Other resist profile parameters, for example, sidewall angle may also be visualized using Bossung Plots. These plots are generally harder to obtain since measuring these shapes is often a difficult endeavor. In most cases, the wafer has to be destroyed, e.g., cut through, so that these parameters can be measured.

It has been found that optical signals obtained from an FEM wafer can also be visualized in a Bossung Plot and the resulting curves can have a similarly shape as the curves in a corresponding CD Bossung Plot. Additionally, the optical signals can be used as a proxy for CD in a technique for determining optimal lithography settings, as well as process monitoring and process control applications. In one example implementation, a COS of a combination of one or more optical signals is used to determine optimal focus.

Figure 3:
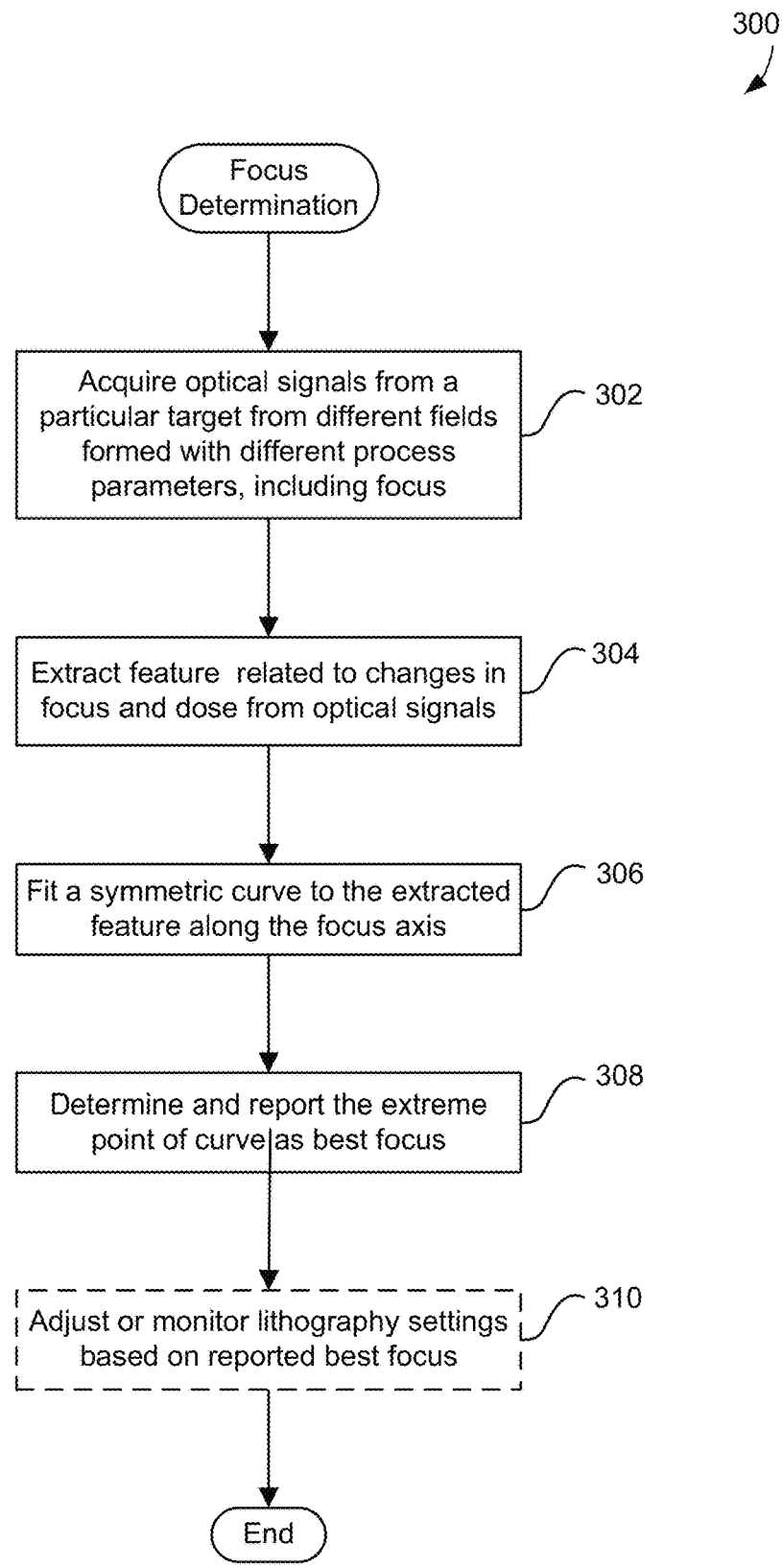
FIG. 3 is a flow chart illustrating a technique for determining optimal focus in accordance with one embodiment of the present invention.

Determining Lithography Process Parameters Using Optical Signals:

FIG. 3 is a flow chart illustrating a technique 300 for determining an optimal focus in accordance with one embodiment of the present invention. Initially, a plurality of optical signals may be obtained from a particular target from different fields formed with different process parameters, including focus, in operation 302. For example, different types of optical signals, such as a plurality of different wavelengths, polarizations, etc., can be acquired from a specific target, at different focus-exposure positions on an FEM wafer, using an optical metrology tool. Since a particular target from different FEM fields is exposed to different conditions, this target will tend to have a different structure in at least some of the different fields.

In more general embodiments, process parameter variations are organized in a Design of Experiments (DOE) pattern on the surface of a semiconductor wafer (referred to as a DOE wafer). In this manner, the optical signal acquisition sites correspond to different locations on the wafer surface having different associated process parameter values. In one example, the DOE pattern is a Focus/Exposure Matrix (FEM) pattern. Typically, a DOE wafer exhibiting a FEM pattern includes a grid pattern of measurement sites. In one grid direction (e.g., the x-direction), the exposure dosage is varied while the depth of focus is held constant. In the orthogonal grid direction (e.g., the y-direction), the depth of focus is varied while the exposure dosage is held constant. In this manner, measurement data collected from the FEM wafer includes data associated with known variations in the focus and dosage process parameters. In the illustrated example, the optical signal data is acquired from a FEM wafer that is processed with known variations in focus and exposure. However, in general, optical signal data associated with known variation of any set of process parameters, structural parameters, or both, are contemplated.

Several embodiments of targets, their fabrication, and their arrangements with respect to measurement sites and fields are described further in U.S. Pat. No. 7,382,447 by Walter Mieher et al. and issued 3 Jun. 2008, which patent is incorporated herein by reference in its entirety. In general, printing of FEM targets may be accomplished in a layer of photoresist by projecting light or radiation through a pattern of a test reticle. The targets may be printed using a different combination of process parameters (test matrix).

The printed targets may be printed in a variety of different wafer layers. In particular, the printed targets are generally printed in a layer of photoresist using standard lithography processes (e.g., projecting a circuit image through a reticle and onto a silicon wafer coated with photoresist). The wafer may be a test wafer with layers of materials that correspond to the materials typically present on product wafers at that step in the test process. The printed targets may be printed over other targets in underlying layers. The wafer may be a product wafer that has the potential to produce working devices. The wafer may be a simple test wafer only used for testing the lithography system. When using multiple test wafers, the same or different test reticles may be used. The different test reticles may have patterns with different dimensions so as to produce a wider range of test data.

The process parameters used to form the printed targets are generally configured to keep the target characteristics within desired specifications. The printed targets may be printed on a test wafer as a part of a test procedure or they may be printed on a production wafer during production. In production, the printed targets are typically printed in the scribe line between device areas (e.g., dies that define the IC) disposed on a production wafer. The measurement sites may be dedicated targets disposed around the device structures or they may be a portion of the device structure (e.g., a periodic portion). As should be appreciated, using a portion of the device structure may be more difficult, but it tends to be more accurate since it is a portion of the device structure. In another embodiment, the printed targets may be printed across the entire test wafer.

The FEM measurement sites are generally located across the focus exposure matrix wafer. In fact, there may generally be one or more measurement sites per field. Each field may be formed using a different combination of focus and exposure (or may be focus or exposure only). For example, a first field may be produced using a first combination, and a second field may be produced using a second combination that is different than the first combination. The multiple combinations can be produced using varying focus and varying exposure, varying focus—constant exposure, constant focus—varying exposure, and the like.

The number of measurement sites may also differ. The number of sites per field is generally smaller on production wafers since the real estate on production wafers is so valuable. Also, fewer measurements are made on a product wafer than on a focus exposure matrix wafer due to time constraints in production. In one embodiment, a single site is measured per field. In another embodiment, multiple sites are measured per field.

In most cases, the measurement site targets are formed from identically designed patterns using different processing parameters. It should be noted, however, that different focus exposure matrices may have different targets. For example, a first test matrix may be performed using a first grating type and a second test matrix may be performed using a second grating type that is different than the first grating type.

The targets may widely vary. The target structure may be in the form of a grating that is typically periodic. The grating may be periodic in one direction (X or Y) as, for example, a line space grating, or it may be periodic in two directions (X and Y) as, for example, a grid space grating. Examples of a grid space grating may include an array of lines in the Y direction with each line being segmented in the X direction. Another grid space example is an array of dot structures. That is, the targets may take the form of a line space grating, grid space grating, checkerboard pattern target, etc. The target design characteristics may each include line width (width at a specific height), line space width, line length, shape, side wall angle, height, pitch, grating orientation, top-profile (degree of top rounding or T topping), bottom profile (footing), etc.

When using multiple printed targets, each may have the same or different characteristics. As should be appreciated, different target characteristics, such as different shapes and pitch, exhibit different response to focus and, therefore, it may be advantageous to measure distinct measurement sites having different characteristics.

The optical signals acquired from the target sites may include any type of signals that have been found to correlate to target parameters, such as CD, sidewall, and height, and also changes in process. For example, scatterometry measurements may contain such information. Example signals include, but are not limited to, any type of spectroscopic ellipsometry or reflectometry signals, including: $\Psi$, $\Delta$, Rs (complex reflectivity of the s polarization), Rp (complex reflectivity of the p polarization), Rs ($|r_s|^2$), Rp ($|r_p|^2$), R (unpolarized reflectivity), $\alpha$ (spectroscopic "alpha" signal), $\beta$ (spectroscopic "beta" signal), and functions of these parameters, such as tan($\Psi$), cos($\Delta$), ((Rs−Rp)/(Rs+Rp)), etc. The signals could alternatively or additionally be measured as a function of incidence angle, detection angle, polarization, azimuthal angle of incidence, detection azimuthal angle, angular distribution, phase, or wavelength or a combination of more than one of these parameters. The signals could also be a characterization of a combination of signals, such as an average value of a plurality of any of the above described ellipsometry and/or reflectometry signal types. The signals may alternatively take the form of images or, rather, a characteristic of such images, such as an intensity value or a combination (e.g., average or addition) of intensity values. Other embodiments may use monochromatic or laser light sources where at least one of the signals may be obtained at a single wavelength, instead of multiple wavelengths.

Scatterometry is a measurement technique that generates optical signals that are dependent on various types of target parameters, such as CD. The target is typically in the form of grating structure, such as a periodic grating structure. In scatterometry, one or more light or radiation beams are made incident on the grating structure and the scattered, reflected and/or diffracted beams emanating from the grating structure are measured. The incident light may be directed toward the target normally or at some angle to the normal. The light emanating from the grating structure is typically scattered, reflected and/or diffracted at various orders, i.e., angles relative to the incident light. The characteristics of the scattered, reflected and/or diffracted light (e.g., intensity, phase, polarization, and the like) at the various orders is measured thereby forming a measurement signal or measured spectra. The characteristics of the scattered, reflected and/or diffracted light generally pertain to information about characteristics of the grating structure. That is, the scattered, reflected and/or diffracted light typically changes in accordance with the shape of the structures and, thus, there is a unique relationship between the measured spectra and the profile of a grating structure and the processed used to fabricate such structure.

The metrology tool can comprise one or more hardware configurations which may be used in conjunction with certain embodiments of this invention to, e.g., measure the various aforementioned optical signals from DOE or FEM sites. Examples of such hardware configurations include, but are not limited to, the following: spectroscopic ellipsometer (SE), SE with multiple angles of illumination, SE measuring Mueller matrix elements (e.g. using rotating compensator(s)), single-wavelength ellipsometers, beam profile ellipsometer (angle-resolved ellipsometer), beam profile reflectometer (angle-resolved reflectometer), broadband reflective spectrometer (spectroscopic reflectometer), single-wavelength reflectometer, angle-resolved reflectometer, imaging system, scatterometer (e.g. speckle analyzer), etc. As should be appreciated, optical metrology, such as scatterometry, is one of the few types of metrology that has true in-situ potential for controlling focus and or exposure during a production run, e.g., optical metrology is suitable for die to die, wafer to wafer, run to run monitoring (and the like). The hardware configurations can also generally be separated into discrete operational systems. On the other hand, one or more hardware configurations can be combined into a single tool.

Referring back to the illustrated technique, a feature related to changes in the focus, as well as changes in other process parameters, may then be extracted from the optical signals in operation 304. In one embodiment, a combination of one or more of the acquired signals that is most sensitive to focus and dose change is extracted. For example, a single signal type, combination of signal types (such as a set of different wavelength ranges), may be extracted as providing more information related to focus and dosage change. In other embodiments, a linear combination, nonlinear combination, or weighted combination of one or more signals may be extracted as the feature from the optical signals.

Any suitable feature extraction technique may be implemented so as to extract a feature from one or more of the optical signals with the best information pertaining to changes in process parameters, such as focus/dose. An operator of the metrology tool may select the feature to be extracted by assessing different signal or signal property combinations through trial and error to determine a best feature that provides a change trajectory with respect to the focus that is similar to a change trajectory in a characteristic of the fabricated structure as a function of focus. An automated analysis of different signals or signal combinations may be executed based on optimization of some criteria, such as selecting the signal or signal combination that forms a set of parabolic shapes (for the different exposures) as a function of focus with minimum noise. Additionally, a combination of wavelength ranges may be selected so as to cancel any effects to the signal caused by targets in lower layers. For instance, certain wavelengths may result in a circular contour pattern with respect to the focus and dose wafer sites, as opposed to parabolic shaped contours for wavelengths that are insensitive to underlying structures. The wavelength ranges that are found to be sensitive to underlying layer targets may be deselected from being used as an extracted feature.

Example automated feature extract techniques include Principal Component Analysis (PCA), Independent Component Analysis (ICA), Local Linear Embedding (LLE) algorithm, etc. Although the following example embodiments are described in terms of using the first principal component resulting from a PCA transformation in order to determine an optimal focus, other embodiments may utilize other feature extraction results or techniques. For instance, the first and second principal components as determined via PCA may be used. Any number of principal components may be selected based on the particular requirements of the application. In yet another example, the output from another feature extraction tool, such as ICA or LLE, may be used. Additionally, other process parameters, besides focus, may be optimized and monitored.

In a PCA embodiment, the extracted feature corresponds to a transformation of the signal dataset onto a different coordinate system and selection of a particular dimension (or direction or projection direction) of such new coordinate system along which the transformed dataset has the most variation, which provides the most information with respect to process parameter changes. Said in another way, a dataset may be created with different combinations of one or more optical signals that can be defined as the variables (columns) for different focus/dose target sites or samples (rows). The first principal component corresponds to a transformed direction or dimension of the PCA-transformed dataset that is found to have the most variation. The second principal component has the second most variation, etc.

Figure 4A:
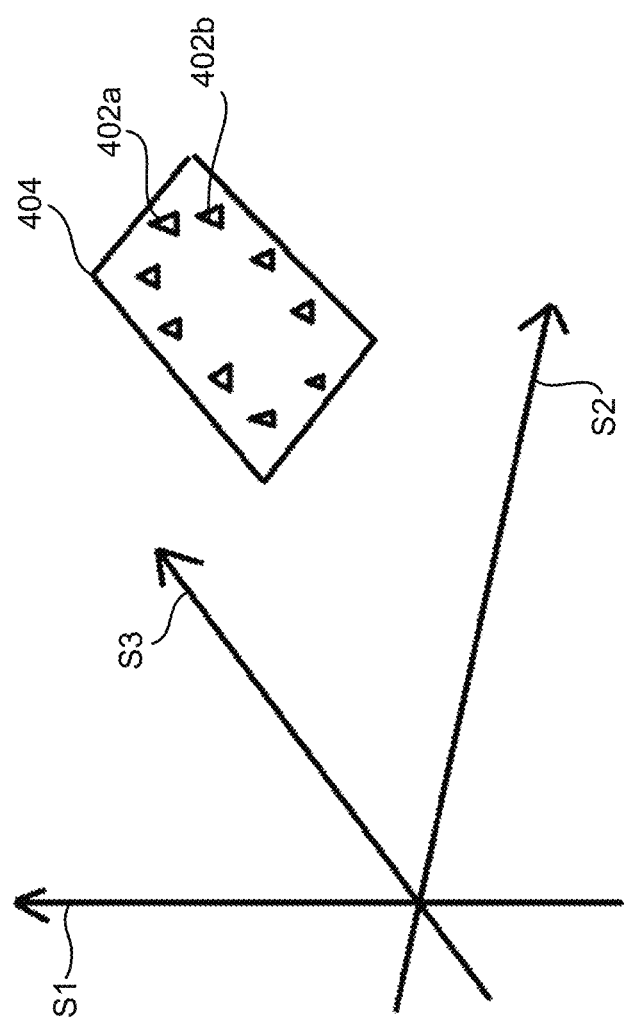
FIG. 4A is a plot of a simplified focus and dose dataset as a function of three signal combinations in accordance with one embodiment of the present invention.

FIG. 4A is a plot of a simplified focus and dose dataset as a function of three signal combinations in accordance with one embodiment of the present invention. As shown, the sample dataset has three dimensions corresponding to signals S1, S2, and S3. For instance, the dataset includes data points 402a and 402b that correspond to two different focus sites. As shown, signal S1 is a constant value for all the data points. That is, the data sets reside in a plane that is perpendicular to the S1 dimension.

Figure 4B:
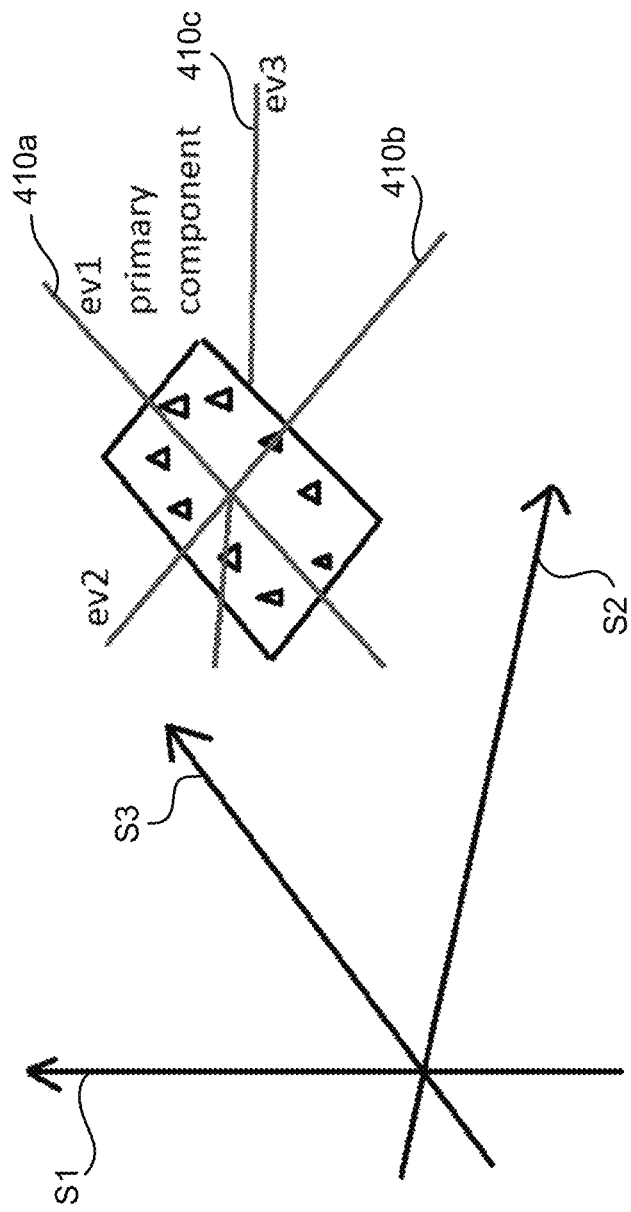
FIG. 4B illustrates the three eigenvectors for the three dimensional dataset of FIG. 4A in accordance with a specific implementation of the present invention.

FIG. 4B illustrates the three eigenvectors for the three dimensional dataset of FIG. 4A in accordance with a specific implementation of the present invention. As shown, the dataset has three eigenvectors ev1 (410a), e2 (410b), and e3 (410c). Each of the eigenvectors also has an eigenvalue that corresponds to the amount of variance in the dataset with respect to such eigenvector. For instance, the principal eigenvector e1 (410a) is associated with the most dataset variance. In contrast, the eigenvector e2 (410b) has significantly less dataset variance, and the eigenvector e3 (410c) has zero dataset variance.

Referring back to FIG. 3, a symmetric curve can then be fitted to the extracted feature along the focus axis in operation 306. That is, any symmetric type of curve may be fit to the extracted feature data. In one specific example, a parabola is fitted to the extracted feature. The extreme point of the curve can then be determined and reported as the best focus in operation 308. For instance, the peak or valley of a fitted symmetric parabola can be defined as the optimal focus. The reported best focus may then be used to adjust or monitor the lithography settings in operation 310. By way of specific examples, the determined optimal focus may be used to adjust or repair the stepper lens system, to choose optimum stepper operating parameters to minimize the negative impact of optical aberrations, or to monitor the stability of the stepper lens system. The optimal focus determination process 300 may then end.

The corrected focus exposure information may be input manually to the lithography tool by an operator or automatically by the system. In most cases, the corrections may be fed into a program or computer that analyzes and decides what actual correction to make. For example, the decision may be to not make a correction, e.g., correction is too small. In addition, there may be other information from other processes that may alter the overall correction.

Figure 5A:
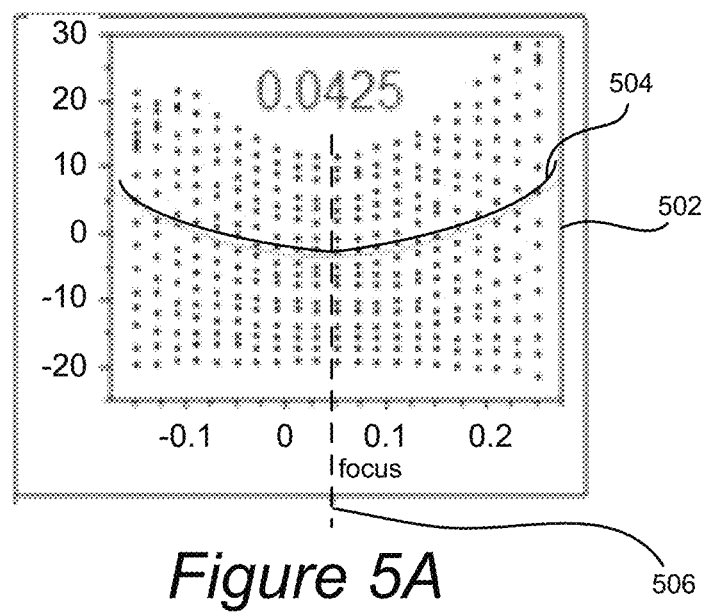
FIG. 5A is a first example Bossung Plot of a set of optical signals' first principal component (PC1) as a function of focus and varying exposure in accordance with one embodiment of the present invention.

Turning back to a PCA example, the focus/dose dataset can be plotted with respect to the principal component. For instance, each sample data point can be plotted with the principal component direction being defined as the y axis and focus being defined as the x axis. The different doses can be represented as different contour lines. A symmetric parabola can then be fitted to this plotted dataset. FIG. 5A includes a first example Bossung Plot 502 of a set of optical signals' first Principal Component (PC1) as a function of focus at varying exposure in accordance with one embodiment of the present invention. The PC1 of the optical signals may be analyzed to determine a curve fit, such as parabola 504 having a polynomial fit degree of 2. In the illustrated example, the fitted curve for PC1 is equal to $3.231847 + 2.9355253*\text{Focus} - 211.48888*(\text{Focus} - 0.04944)^2$. For this curve function, the minimum PC1 point corresponds to an optimal focus 506 of 0.0425.

Figure 5B:
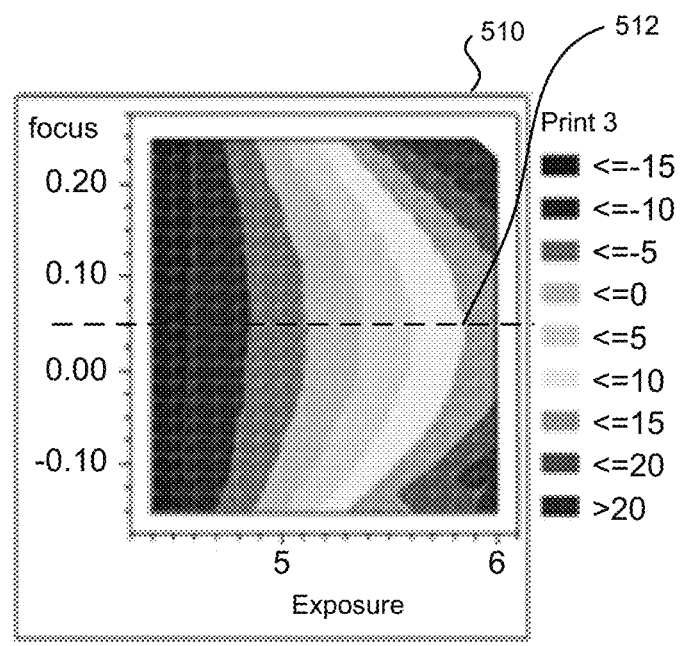
FIG. 5B includes a second example of the optical signals' PC1 mapped as a set of wafer contour areas as a function of focus and varying exposure in accordance with another embodiment of the present invention.

FIG. 5B includes a second example of the optical signals' PC1 that are mapped as a set of wafer contour areas as a function of focus and dose in accordance with another embodiment of the present invention. The contour areas correspond to different PC1 values that are calculated from the fitted curve function for particular sets of focus and exposure values. Different PC1 values can be given different colors and mapped to the corresponding FEM sites to form a PC1 wafer map. These contours can also be analyzed to determine a maximum point of the contour curves that also corresponds to an optimal focus 512 of 0.0425.

Figure 5C:
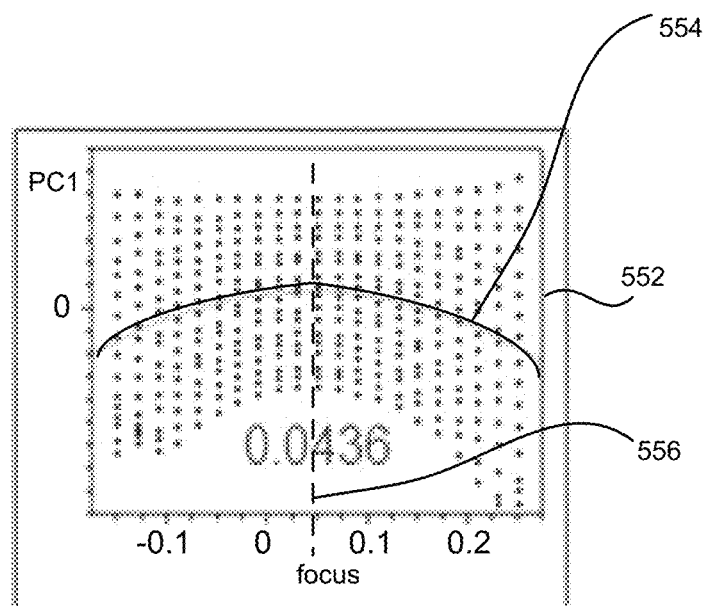
FIG. 5C is a Bossung Plot of the first principal component (PC1) for a set of CD values, which are simulated from the same FEM reticle structures that are used to fabricate the FEM wafer targets of FIGS. 5A and 5B.
Figure 5D:
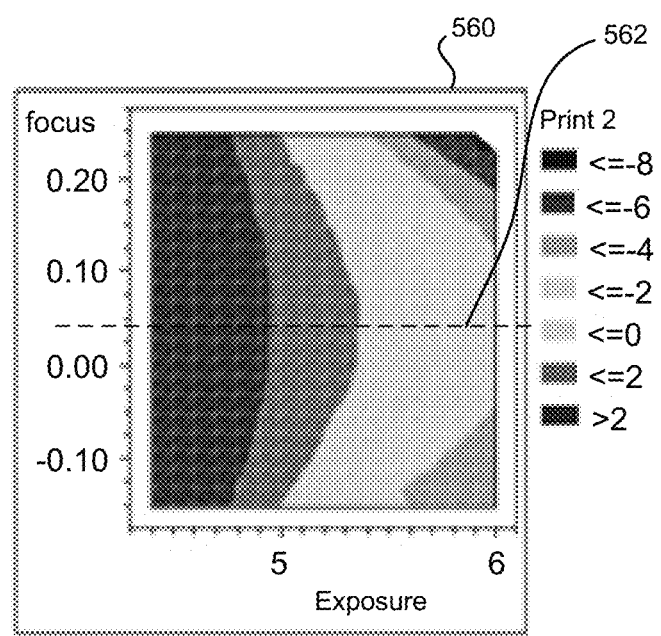
FIG. 5D includes wafer map of a set of CD values transformed to their first principal component PC1 and arranged as a set of contour areas as a function of focus and varying exposure.

Determining an optimal focus based on feature extraction with respect to optical signals appears to provide results that are consistent with applying feature extraction to CD values obtained from the same FEM sites. FIG. 5C is a Bossung Plot 552 of the first principal component (PC1) for a set of CD values, which are simulated from the same FEM reticle structures that are used to fabricate the FEM wafer targets of FIGS. 5A and 5B. For a comparison of results, the CD values can be obtained via actual measurements on the FEM wafer targets or simulation. In the illustrated example, the fitted curve 554 for PC1 is equal to $0.8792593-0.6781819*focus-57.945882*(focus-0.04944)^2$. For this curve function, the maximum PC1 point corresponds to an optimal focus 556 of 0.0436. Likewise, FIG. 5D includes a wafer map 560 of a set of CD values transformed to its first principal component PC1 arranged as a set of contour areas as a function of focus and dose. Accordingly, the CD Bossung Plots product substantially the same optimal focus 0.0436 (560) as the optical signals' principal component Bossung Plots of FIGS. 5A-B.

Certain techniques of the present invention provide an efficient, non-destructive way to determine optimal focus. Additionally, certain techniques for determining focus or other process parameters can be implemented without use of models.

The process for determining optimal focus can be applied to multiple target types (e.g., repeating the process 300 of FIG. 3 with a different particular target having different design characteristics, such as pitch, CD, etc.). Simultaneous solutions using multiple types of targets generally overcome problems associated with process parameter dependencies on target parameters that allow multiple solutions of the process parameters for a given target parameter value. For example, in the case of a particular line width, the focus exposure dependence is non-linear in focus and allows for multiple solutions for focus, even if the exposure dose is known accurately. Simultaneous solutions also can remove the degeneracy between solutions that may be encountered when solving for focus and/or exposure with information from only one parameter (different target parameters may have different dependences on focus and exposure). Using focus solutions determined from many focus exposure matrix measurements can average out measurement errors, stepper errors, and the like.

Since each position in any particular exposure field of the lithography tool may also be associated with a slightly different tilt position (and corresponding focus offset position), a same target may be formed on multiple positions of each exposure field on the FEM wafer to determine an optimum focus for different field positions. An optimum focus for each field position can then be determined based on the optical signals obtained from each field position from the multiple fields (e.g., exposed at different doses and different programmed focus). The optimum focus for each field position can then be used to program an optimum focus tilt for the entire exposure field to achieve different optimum focus values for different field positions.

Although an optimal or best focus can be determined, a lithography tool may actually program a different focus that may be caused by difficulties the tool has in sensing an accurate position of the wafer surface. That is, it may be difficult for the lithography tool to achieve a particular depth of focus with respect to the actual wafer surface. A particular optimum depth of focus with respect to a relatively transparent film, such as a photoresist material that is disposed over layers having other grating structures, is especially difficult to achieve. Consequently, the resulting programmed focus may not be equal to the input best or optimal focus.

Figure 6:
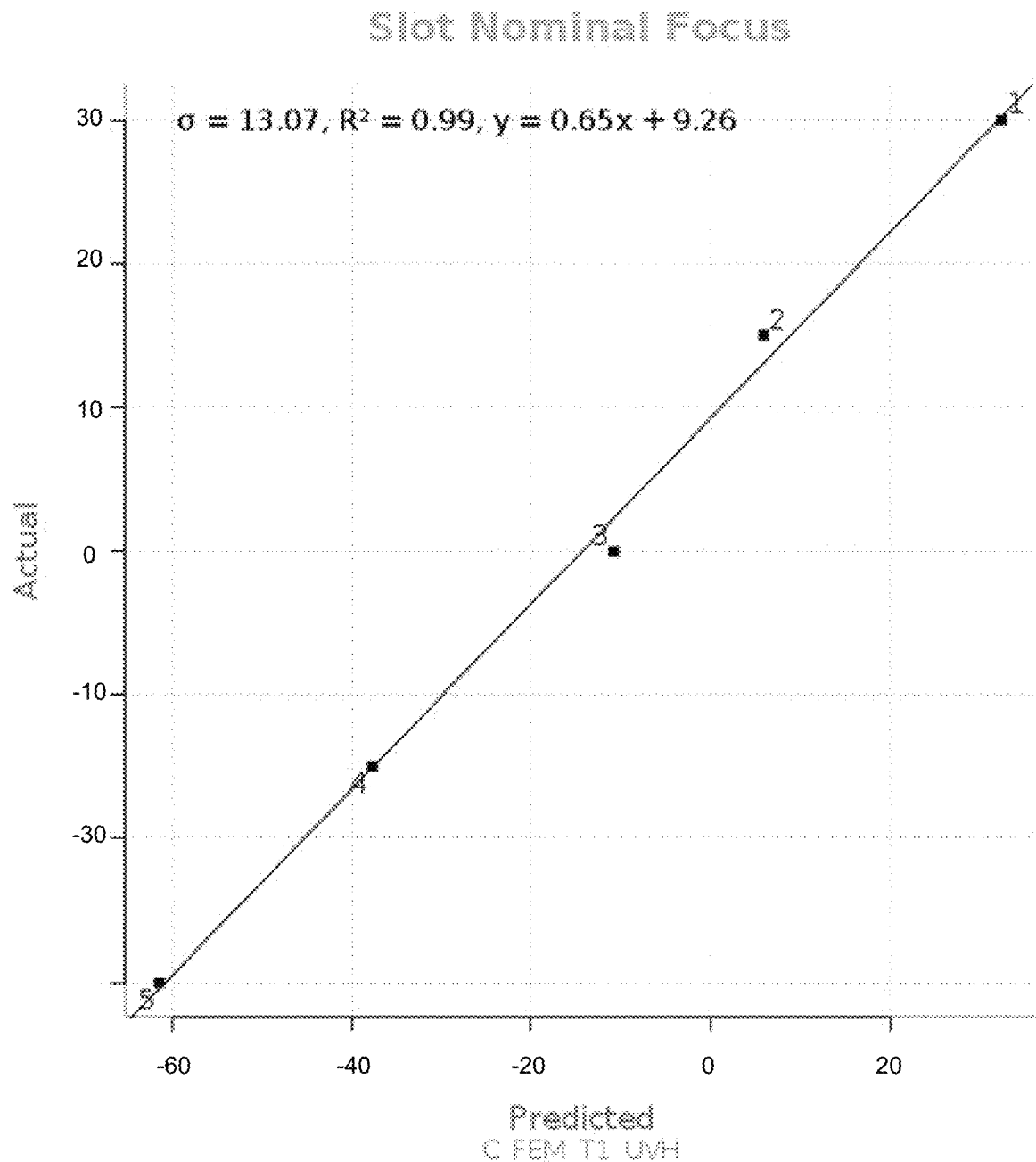
FIG. 6 is an example relationship between optimal focus and programmed focus in accordance with an alternative embodiment of the present invention.

Certain embodiments of the present invention may also provide ways to monitor the programmed focus. A relationship between the best and programmed focus can be determined ($focus_{best}=f(Focus_{programmed})$) based on the FEM dataset from multiple FEM wafers with programmed focus offsets. This relationship can be used as calibration for a model-less focus measurement. That is, the relationship can be used to adjust the focus. FIG. 6 is an example relationship between optimal focus and programmed focus in accordance with an alternative embodiment of the present invention. Each point corresponds to a particular optimal or "predicted" focus (determined from a particular set of FEM signals) and programmed "actual" focus.

By determining a relationship between the best and programmed focus, a separate model to derive the actual focus from geometric parameters (or optical signals) is not required. Because process variation is captured by this relationship, actual can be measured even when the underlying structure topology is changing due to process variations. This is impossible, or very difficult to model using existing model-based metrology methods. Traditionally, model-based semiconductor metrology includes formulating a metrology model that attempts to predict the measured optical signals based on a model of the interaction of the measurement target with the particular metrology system. The target-specific model includes a parameterization of the structure in terms of the physical properties of the measurement target of interest (e.g., film thicknesses, critical dimensions, refractive indices, grating pitch, etc.). In addition, the model includes a parameterization of the measurement tool itself (e.g., wavelengths, angles of incidence, polarization angles, etc.).

However, it may be beneficial to expand the above described techniques to include calibration techniques for determining any structure parameter from the acquired signals (e.g., geometric or material parameter). For instance, a parameter model may be trained based on known reference structures so as to predict optical signals for specific structure parameters. The parameter model can then be used to determine the specific structure parameters from the acquired optical signals of an unknown structure, such as a DOE/FEM or any other test structure, for any suitable application, such as monitoring process variation effects on particular structure parameters.

Elimination of Underlayer Variation from Optical Signals:

The underlayers and their structure can affect any optical signals that are acquired from a particular test structure and, accordingly, such acquired optical signals may include information regarding the particular target's structure parameters, as well as the underlayers. In alternative embodiments of the present invention, the effect of underlayers on the acquired optical signals is substantially eliminated so as to isolate signals that retain only (or mostly) information regarding the top layer structures. Said in another way, optical signals that have information regarding the "parameter of interest" or "POI" are isolated from the acquired optical signals, while underlayer effects are substantially eliminated from such signals.

Figure 7:
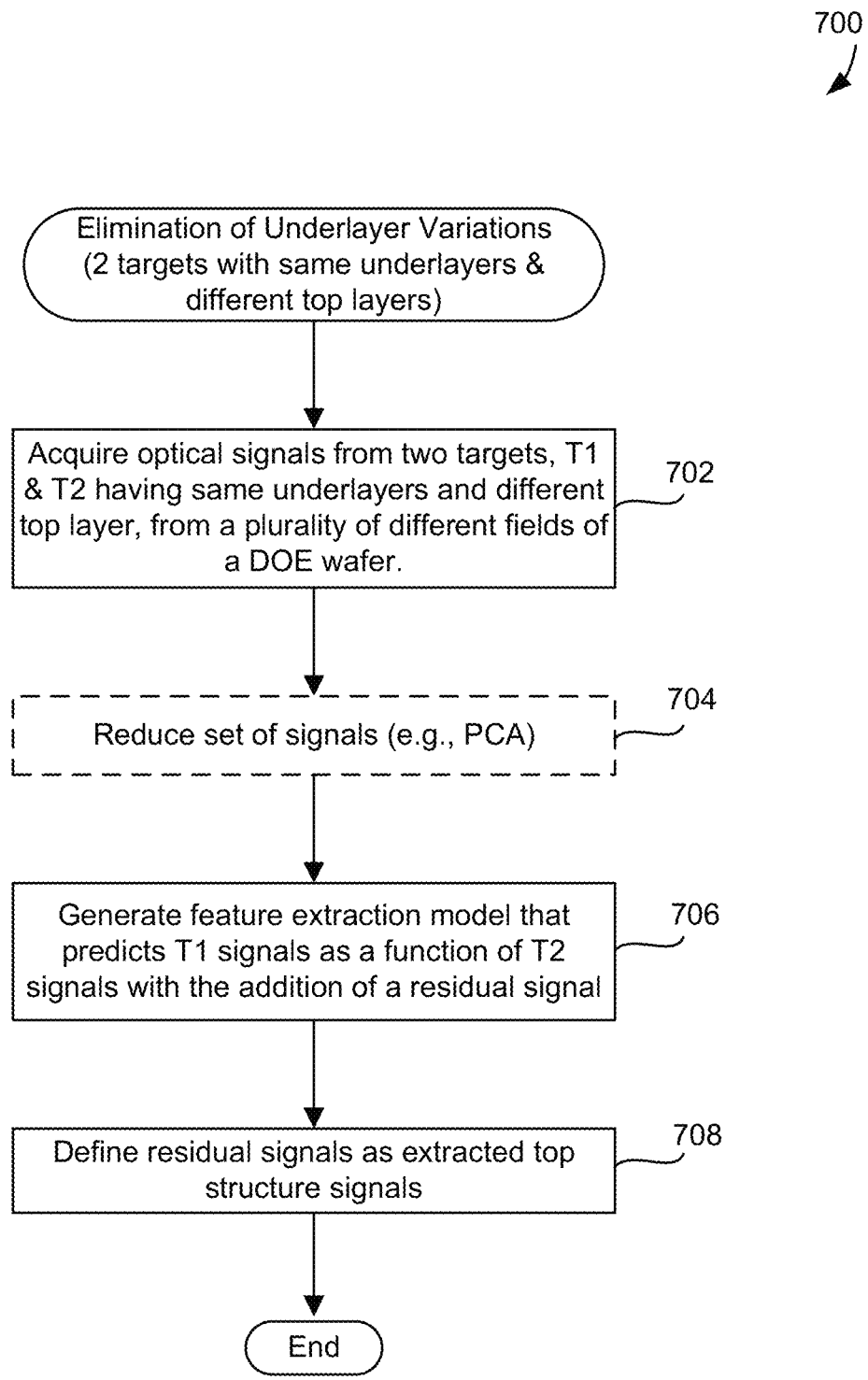
FIG. 7 is a flow chart illustrating a process 900 for extracting a top structure parameter-of-interest (POI) from targets having the different top layer and same underlayers.

Certain alternative embodiments of the present invention include techniques that implement two or more targets for determining optimum focus (and the like). Although some of the following techniques are described as utilizing two different targets T1 and T2, the techniques may also use multiple T1 and multiple T2 targets. FIG. 7 is a flow chart illustrating a process 700 for extracting a top structure parameter-of-interest (POI) from targets having different top layers and the same underlayers in accordance with one embodiment of the present invention.

Figure 8:
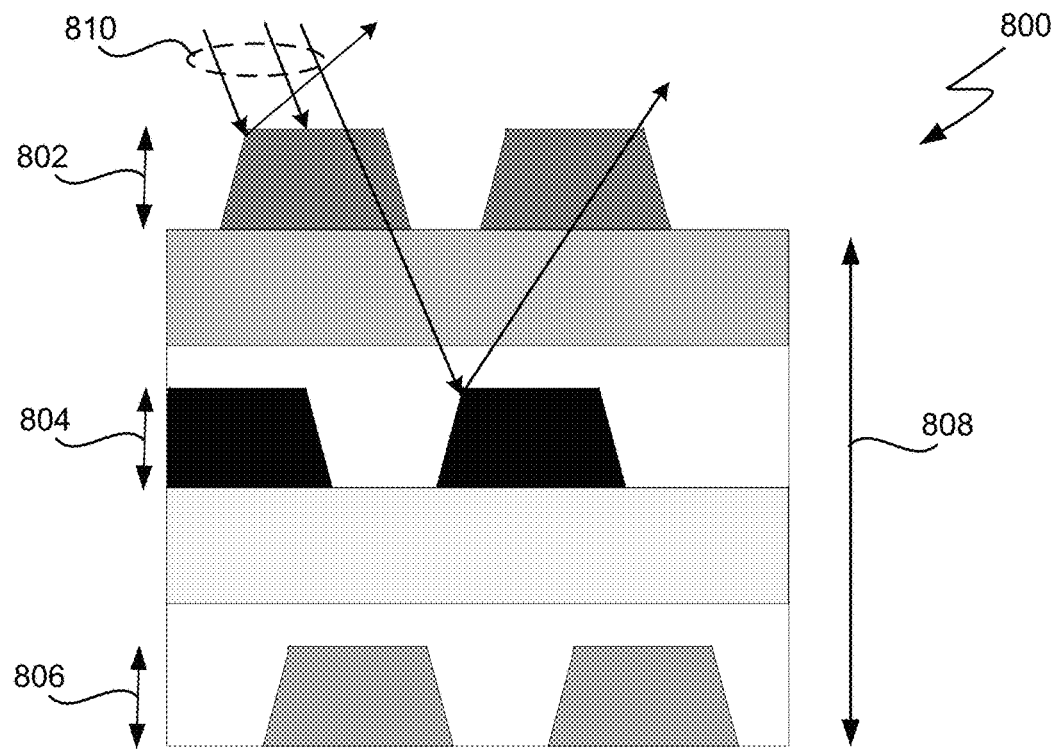
FIG. 8 is a diagrammatic side view representation of an example first target in the form of a top layer grating formed over a plurality of underlayers, some of which also include grating structures.

Any suitable two targets may be utilized to eliminate the underlayer variations. In general, each target may include various underlayer structures that are formed as a result of the numerous fabrication layers that make up a portion of the fabrication process for a finished device or production wafer. Each of these layers in the fabrication process may include corresponding test structures. FIG. 8 is a diagrammatic side view representation of an example first target 800 in the form of a top layer grating 802 formed over a plurality of underlayers 808, some of which also include grating structures (e.g., 804 and 806).

Spectra 810 may be directed to be incident on the top layer 802 of this first target 800. However, since the top layer 802 is semi-transparent, the incident light may also reach some of the underlying structures, such as gratings on layers 804 and 806. At least some of the underlying grating structures and the top grating structures will tend to scatter the incident light to cause both reflected and scattered light to interact with each other and result in output light that is dependent on both the top and underlying layer structures. Accordingly, the output light acquired from this target 800 contains information regarding both the top layer 802 and the underlying layers 808. This output signal cannot be effectively used to determine a process or top structure parameter, such as optimum focus or CD, since such output signal is compromised by the underlying structures.

Figure 9:
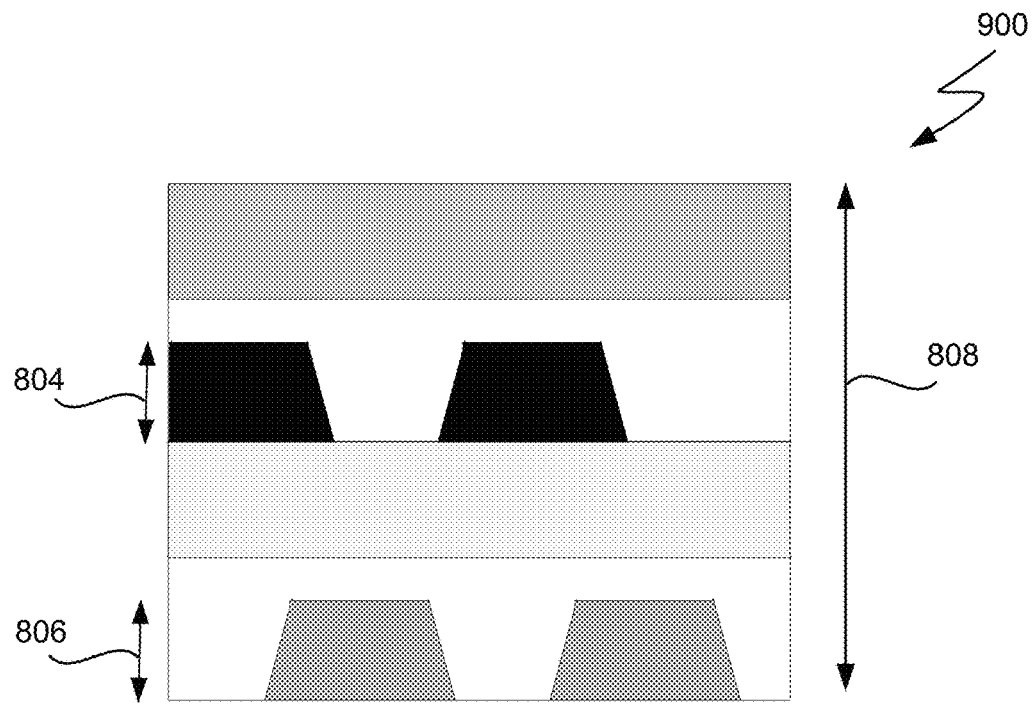
FIG. 9 is a diagrammatic side view representation of a second target that has the same underlayers as the target of FIG. 8, but excludes the top layer structures of FIG. 8.

For the illustrated technique, optical signals can also be extracted from a second target T2 that includes all the underlying layer structures 808 that are formed below the top structure of the first target T1 (800), but excludes the top structure 802 of the first target T1. An example second target T2 (900) is shown in FIG. 9. The two targets T1 and T2 of each field are preferable located near each other so that there is unlikely to be any process variation between such two targets. For instance, the two targets T1 and T2 are formed adjacent to one another in a same DOE field.

A plurality of optical signals can be acquired from the two targets T1 and T2 from a plurality of different fields of a DOE wafer. In this example, the two targets T1 and T2 have the same underlayer, but different top layers. For example, T1 has a top structure (FIG. 8), while T2 does not have such top structure (FIG. 9).

By way of example, a plurality of different signals at different wavelengths, etc., as described above, may be collected from two targets within each DOE field. The signals may then be reduced in operation 704. For example, the dataset of signals may be reduced by a PCA technique or by any of other data reduction technique, such as the ones described herein. Other reduction techniques include kPCA (kernel principal component analysis), LLE (local linear embedding), NLPCA (non-linear PCA), etc.

A feature extraction model that predicts the T1 signals as a function of T2 signals may then be generated with a residual signal in operation 706. For instance, the feature extraction model can be expressed in the following equation:

$$S_{T1}=f(S_{T2})+R$$

where $f(S_{T2})$ is a function that utilizes all of the T2 signals, such as different wavelength signal responses, for a particular T2 target of a particular field or set of process values to predict each T1 signal of the same particular field, such as each particular wavelength response signal, with a leftover R residual signal. Function $f(S_{T2})$ may be determined by any suitable training technique, such as Fast-reduced-order models; regression; machine-learning algorithms such as neural networks, support-vector machines (SVM), etc.

The residual signals can then be defined as the extracted top structure signals in operation 708. More specifically, the generated function can then be used to extract the signal response for the top structure of the T1 target from each $S_{T1}$ signal by:

$$R=f(S_{T2})-S_{T1}$$

The residual R signals that are extracted from each particular T1 signal will retain focus and dose information, as well as information related to the top layer structure parameters. The R signals contain the point-of-interest (POI) variation and contain very little or no variations from the parameters that are the same between T1 and T2, such as the underlayer structures. Systematic errors are also canceled because such error is likely to be the same for T1 and T2 since they are located close to each other in the same field.

The extracted residual signals can then be used in any suitable manner. For example, the residual signals may be used to determine optimal focus as described above. In other embodiments, any suitable process and/or structure parameter may be determined. For instance, a parameter model may be trained to predict process or geometric parameters from the extracted signal features based on reference data from known structures. For instance, the reference data can be determined by performing CD-SEM on a set of reference structures from which optical signals are also collected. The parameter model is then trained using the known reference optical signals from the known reference structures. The parameter model can then be used to determine a geometric parameter of an unknown target or structure, such as the DOE structures or other structures from other wafers, resulting from process variation based on residual signals determined by the feature extraction model.

Figure 10:
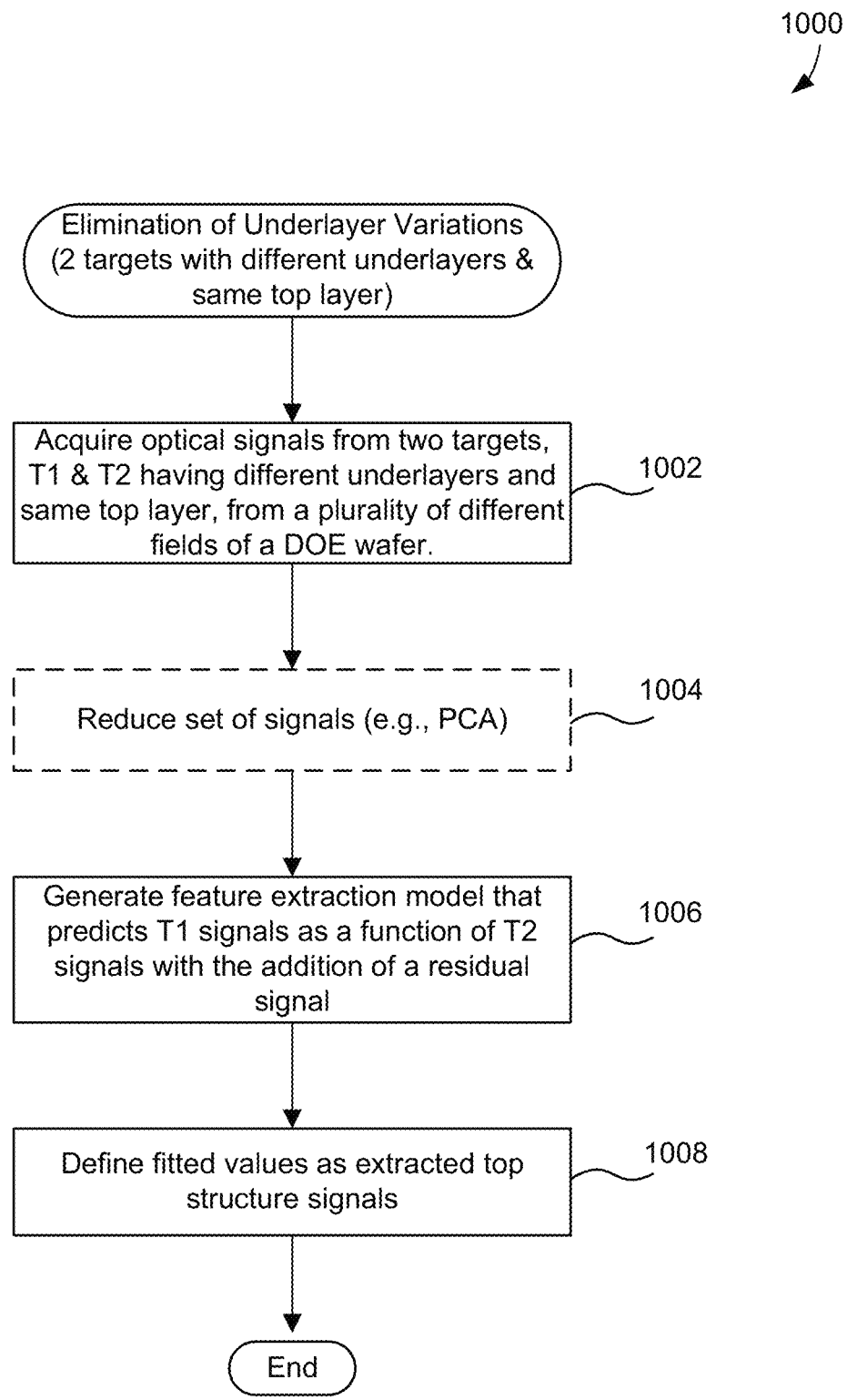
FIG. 10 is a flow chart illustrating an alternative process for extracting a top structure POI from targets having both top layer and underlayer structures in accordance with an alternative embodiment of the present invention.

Other types of targets may be utilized to eliminate the underlayer signal and predict the top structure signal. FIG. 10 is a flow chart illustrating an alternative process 1000 for extracting a top structure POI from targets having the same top layer and different underlayers in accordance with an alternative embodiment of the present invention. For example, parts of the underlayer structures differ between the targets.

In this implementation, optical signals are acquired from two targets having different underlayers, but a same top layer, from different fields of a DOE wafer in operation 1002. Similar to FIG. 9, the set of acquired signals can also be reduced in operation 1004 and a feature extraction model that predicts T1 signals as a function of T2 signals with a residual signal, e.g., $S_{T1}=f(S_{T2})+R$, can also be generated in operation 1006.

In this embodiment, the fitted values $f(S_{T2})=S_{T1}-R$ may be defined as the extracted top structure signals in operation 1008. These extracted top structure signals contain the POI variations that are the same for T1 and T2 (in the top layer). Random noise may also be reduced because the noise is different for T1 and T2 and such noise is incorporated into R together with the underlayer signal differences. The extracted POI signals may then be used to determine optimal focus, process or structure parameters from unknown structures via use of a reference or training data.

Figure 11:
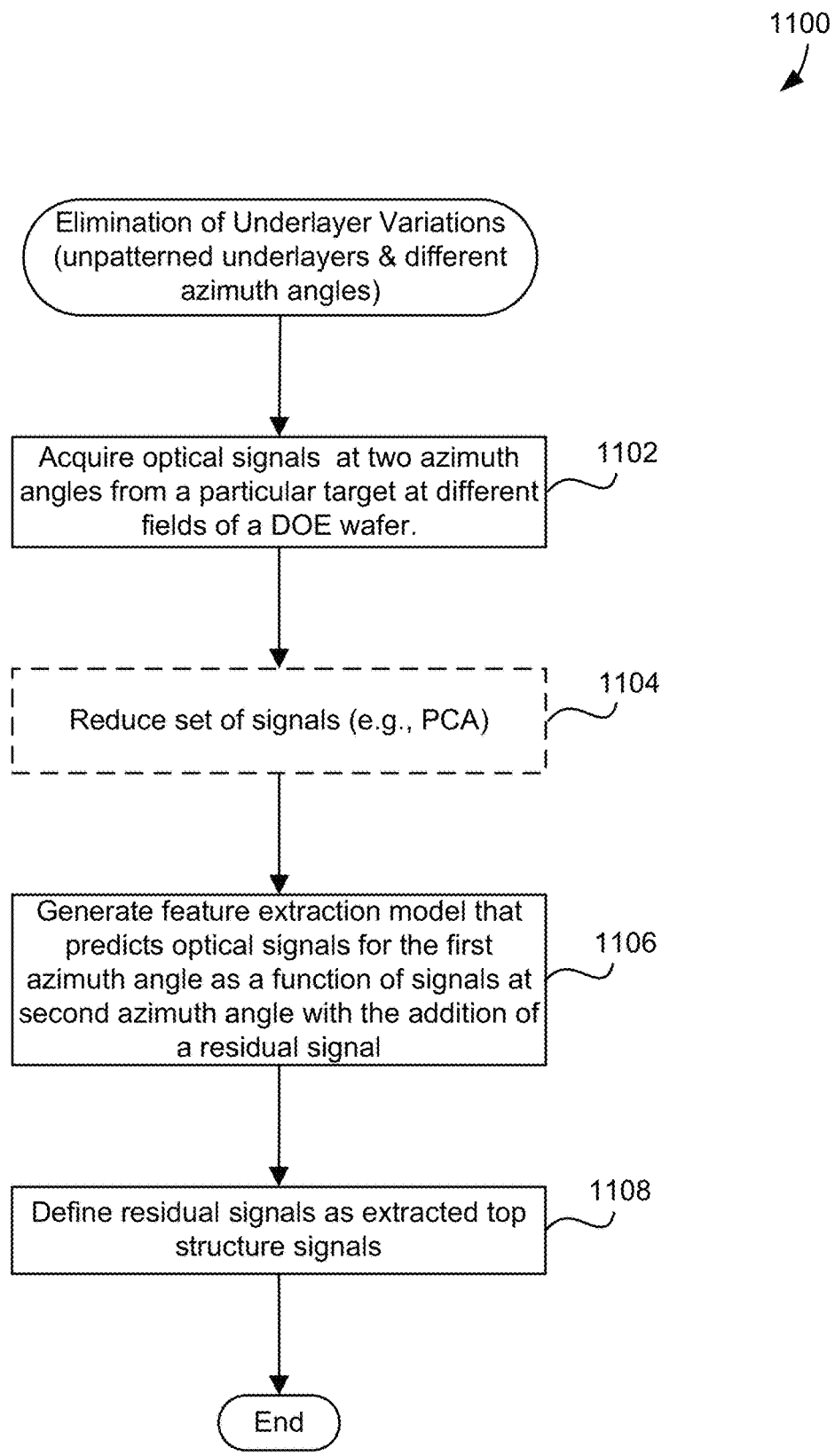
FIG. 11 is a flow chart illustrating another process for extracting a top structure POI from targets having unpatterned underlayers using two or more azimuth angles in accordance with another embodiment of the present invention.

In another underlayer elimination embodiment, FIG. 11 is a flow chart illustrating another process 1100 for extracting a top structure POI from targets having unpatterned underlayers using two or more azimuth angles in accordance with another embodiment of the present invention. Initially, optical signals at two different azimuth angles are acquired from a particular target at different fields of a DOE wafer in operation 1102. The different azimuth angle optical signals may also be obtained at different wavelengths, etc., as described above, may be collected from the particular targets within each DOE field.

The POI will have a different sensititvity to different azimuth angles. In general, the two azimuth angles may include any suitable angles, such as angles that are orthogonal to each other (zero and 90° angles) for increased sensitivity to grating or pattern defects (although not required). For example, spectra measurements may be obtained at directions perpendicular and parallel to the grating direction. The signals may also be reduced in operation 1104.

A feature extraction model that predicts optical signals at the first azimuth angle as a function of optical signals at the second angle with a residual signal may then be generated in operation 1106. For a zero azimuth ($Az_0$) and a 90° azimuth ($Az_{90}$), the model can be represented as:

$$S_{az0}=f(S_{az90})+R$$

The residuals can then be defined as the extracted top structure signals in operation 1108. For instance, the top structure signals $R=f(S_{az90})-S_{az0}$. The resulting R signals contain the POI variation information and contain very little or no variations from the parameters of the unpatterned layers. Some systematic error are canceled because such errors are the same for $S_{az0}$ and $S_{az90}$. The extracted POI signals may then be used to determine optimal focus, process or structure parameters from unknown structures via use of a reference or training data.

Figure 12:
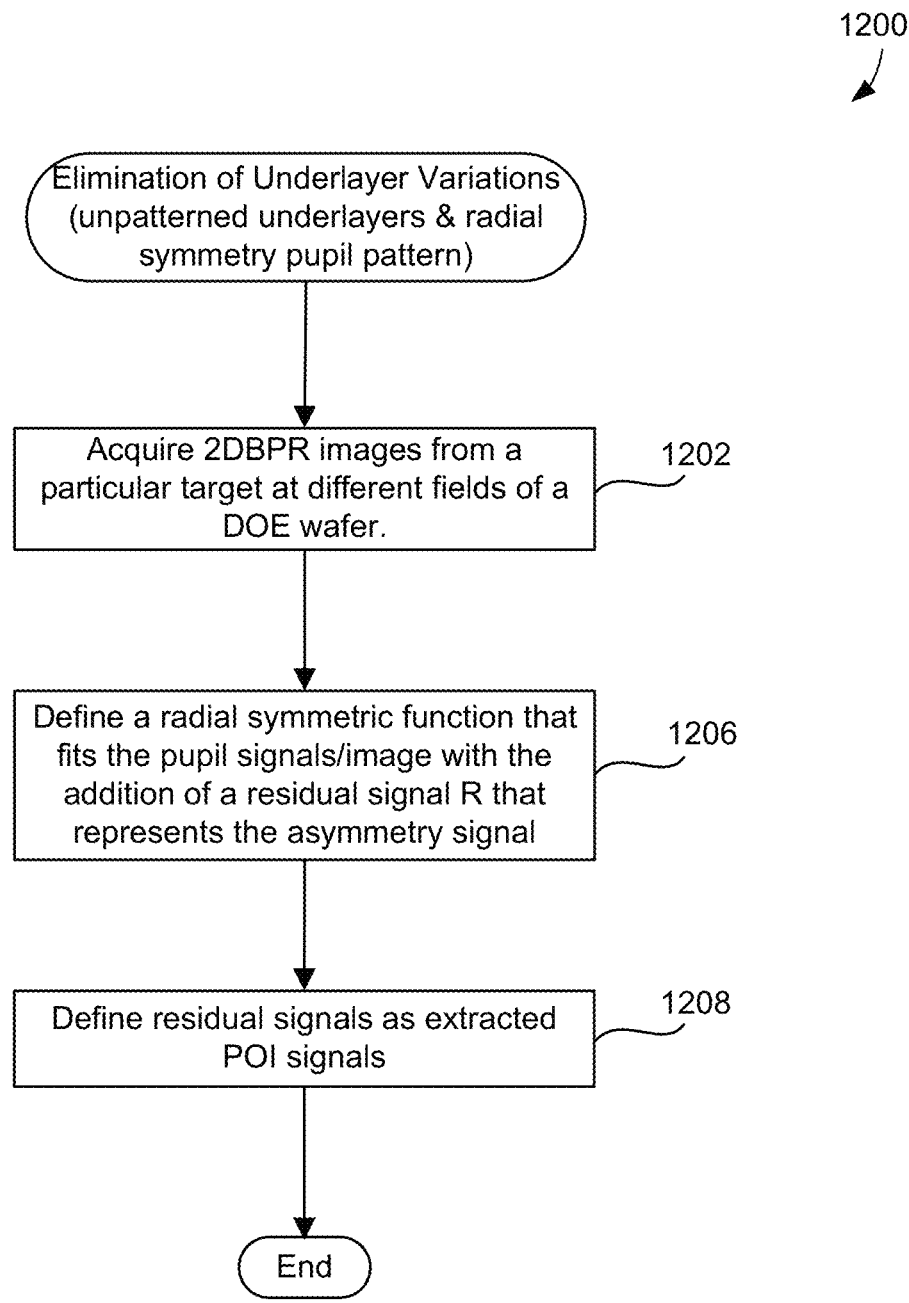
FIG. 12 is a flow chart illustrating a procedure utilizing two-dimensional beam profile reflectometry (2DBPR) in accordance with an alternative embodiment.

FIG. 12 is a flow chart illustrating a procedure utilizing two-dimensional beam profile reflectometry (2DBPR) in accordance with an alternative embodiment. Initially, 2DBPR images are acquired from a particular target at different fields of a DOE wafer in operation 1202. In the illustrated example, the target may have unpatterned underlayers with a top grating structure. The 2DBPR system is an angle-resolved system and produces a pupil image in which each pixel corresponds to a same angle of incidence (AOI), but different azimuth angles. Pixels that are on a line starting at the center of the pupil image have the same azimuth angle, but different AOI angles.

A 2DBPR image is radially symmetric when the measured sample resembles film and non-radially symmetric when the sample has some periodic structure. Using this feature, a radially symmetric function g( ) can be fit to the 2DBPR image with the addition of an asymmetry R signal: $S_{raw}$= g( )+R. In the illustrated embodiment, a radial symmetric function g( ) that fits the pupil signals/image $S_{raw}$ may be defined in operation 1206. The residual signals correspond to the grating, while the function g( ) corresponds to a film. The R signals can then be defined as extracted POI signals of the grating structure in operation 1208, and then utilized in to determine any suitable process and/or structure parameter, for example, via a trained parameter model or any calibration technique described herein. In an alternative embodiment, instead of fitting a function to the acquired signals, the signals from a pad (or no grating structure) can be subtracted from the acquired signals obtained from the grating target to extract the grating signals.

In the examples of FIG. 10 or 11, the fitted values may be used to measure parameters that are insensitive to azimuth change. Example parameters that are insensitive to azimuth change may include film thicknesses, material n,k properties, etc. Conversely, parameters that are sensitive to azimuth change include grating parameters, critical dimension (CD), side-wall angle (SWA), height (HT), etc.

In alternative embodiments, a differential method may be applied to any model-based structure characterization approach, which suffers from underlayer and structure parameter correlations. For example, subtracting similar signals, e.g. ellipsometric parameters such as alphas, collected at the same angle of incidence and azimuth angle, acquired for different targets (e.g. targets with top structure and targets without such top structure), may help to reduce or eliminate underlayer variations. Alternatively, signals from the same target but at different azimuth angles (e.g. 0 and 90 degrees) can be collected, and these differential signals can be used to enhance and decorrelate a grating signal from the underlayer signal. Several techniques for using difference signals from two or more azimuth angles on a same target are described further in U.S. patent, having Ser. No. 14/449,646, filed 1 Aug. 2014 by Thaddeus Gerard Dziura et al., which application is incorporated herein in its entirety for all purposes. In general, the difference signals tend to cancel the common unperturbed film signal and leave the contribution due to grating perturbation or defects. A difference signal of zero corresponds to a nondefective grating.

A similar approach can be used for 2DBPR since the main signals in each pupil image are dominated by the reflection from the grating-free underlying structure. For instance, the vertical-to-vertical polarization image is identical to the horizonal-to-horizontal polarization reflectivity (but rotated 90 degrees). Using the differential signal can help to suppress contributions from the substrate and the underlayers.

Process parameters generally refer to parameters used to control the processing conditions of the lithography system. Process parameters generally affect the pattern in a nontrivial way. By way of example, process parameters may correspond to focus offset, exposure dose, resist thickness, develop time and temperature, post exposure bake time and temperature and the like. The determined process settings may be used to improve the control of subsequent lithographic patterning and to determine whether the quality of the photolithographic pattern meets specified requirements. Process parameter determination or monitoring may be suitable for a wide variety of photolithography processes, as for example, photolithographic processes pertaining to semiconductor manufacturing, optical device manufacturing, micro-mechanical device manufacturing, magnetic recording data storage manufacturing and the like. Although process parameter determination or monitoring may be used in any of the above processes, certain embodiments of the invention described herein is directed at semiconductor manufacturing for ease of discussion.

While certain implementations of this invention have been described in terms of several preferred embodiments, there are alterations, permutations, and equivalents, which fall within the scope of this invention. For example, although the term wafer was used throughout (e.g., semiconductor), it should be noted that the term wafer may also apply to workpieces, substrates, samples and the like (which are associated with other types of manufacturing) when certain techniques of the invention are used in other types of manufacturing. It should also be noted that there are many alternative ways of implementing the methods and apparatuses of the present invention. For example, although certain embodiments of the invention has been described in terms of photolithography that uses conventional radiation techniques, it should be noted that other lithography techniques may also be used, for example, UV lithography (which uses ultra violet), X-ray lithography (which uses X-ray), e-beam lithography (which uses electron beam), and ion beam (which uses ion beam).

Any suitable combination of hardware and/or software may be used to implement any of the above described techniques. In a general example, a metrology tool may comprise an illumination system which illuminates a target, a collection system which captures relevant information provided by the illumination system's interaction (or lack thereof) with a target, device or feature, and a processing system which analyzes the information collected using one or more algorithms. Metrology tools can generally be used to measure various radiation signals pertaining to structural and material characteristics (e.g., material composition, dimensional characteristics of structures and films such as film thickness and/or critical dimensions of structures, overlay, etc.) associated with various semiconductor fabrication processes. These measurements can be used to facilitate process controls and/or yield efficiencies in the manufacture of semiconductor dies.

The metrology tool can comprise one or more hardware configurations which may be used in conjunction with certain embodiments of this invention. Examples of such hardware configurations include, but are not limited to, the following: Spectroscopic ellipsometer (SE), SE with multiple angles of illumination, SE measuring Mueller matrix elements (e.g. using rotating compensator(s)), single-wavelength ellipsometers, beam profile ellipsometer (angle-resolved ellipsometer), beam profile reflectometer (angle-resolved reflectometer), broadband reflective spectrometer (spectroscopic reflectometer), single-wavelength reflectometer, angle-resolved reflectometer, imaging system, and scatterometer (e.g. speckle analyzer)

Figure 13:
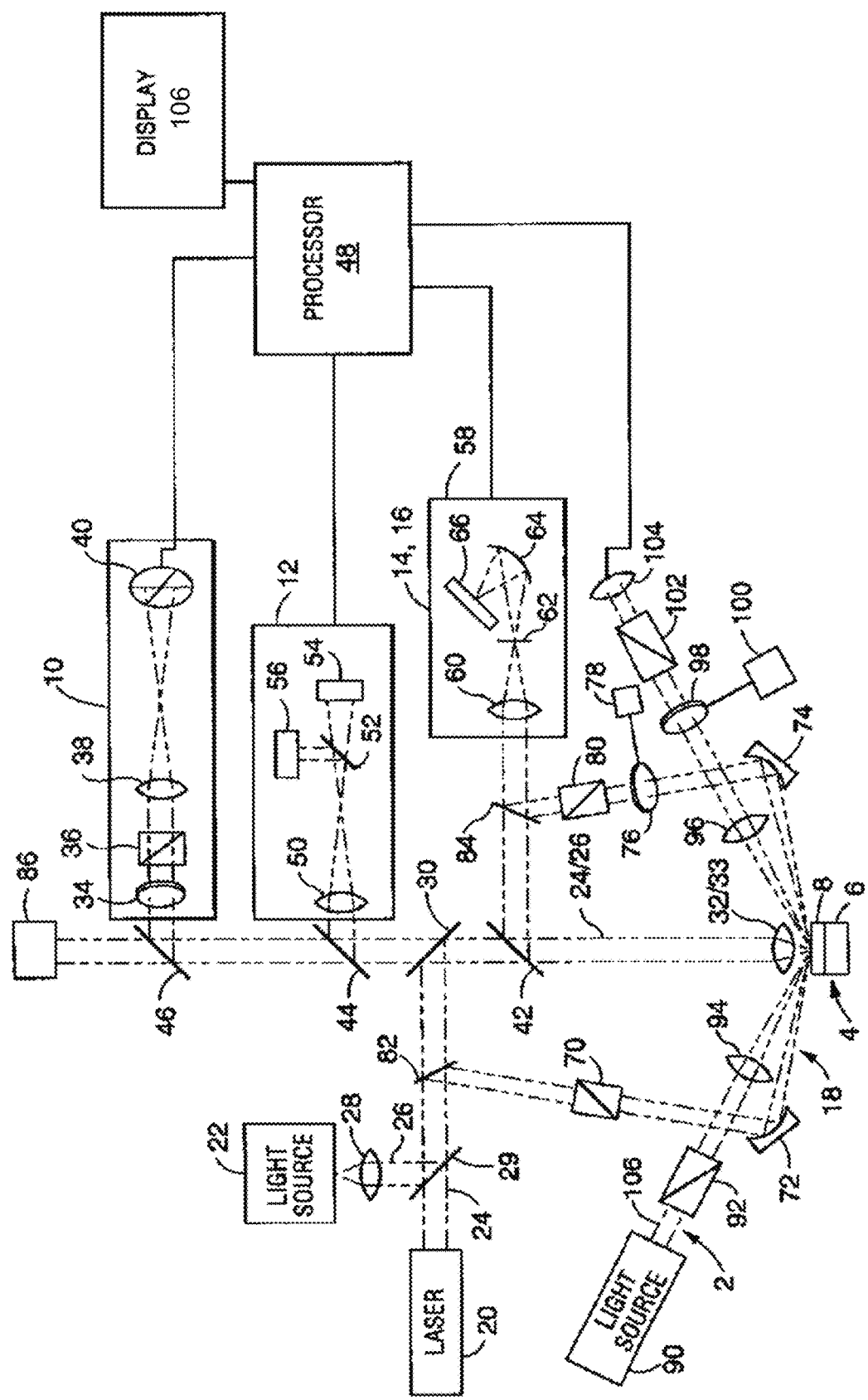
FIG. 13 illustrates a metrology system in accordance with one embodiment of the present invention.

The hardware configurations can be separated into discrete operational systems. On the other hand, one or more hardware configurations can be combined into a single tool. One example of such a combination of multiple hardware configurations into a single tool is further illustrated and described U.S. Pat. No. 7,933,026, which patent is herein incorporated by reference in its entirety for all purposes. FIG. 13 shows, for example, a schematic of an exemplary metrology tool that comprises: a) a broadband SE (e.g., 18); b) an SE (e.g., 2) with rotating compensator (e.g., 98); c) a beam profile ellipsometer (e.g., 10); d) a beam profile reflectometer (e.g., 12); e) a broadband reflective spectrometer (e.g., 14); and f) a deep ultra-violet reflective spectrometer (e.g., 16). In addition, there are typically numerous optical elements (e.g., 92, 72, 94, 70, 96, 74, 76, 80, 78, 98, 100, 102, 104, 32/33, 42, 84, 60, 62, 64, 66, 30, 82, 29, 28, 44, 50, 52, 54, 56, 46, 34, 36, 38, 40, and 86) in such systems, including certain lenses, collimators, mirrors, quarter-wave plates, polarizers, detectors, cameras, apertures, and/or light sources. The wavelengths for optical systems can vary from about 120 nm to 3 microns. For non-ellipsometer systems, signals collected can be polarization-resolved or unpolarized. FIG. 13 provides an illustration of multiple metrology heads integrated on the same tool. However, in many cases, multiple metrology tools are used for measurements on a single or multiple metrology targets. Several embodiments of multiple tool metrology are further described, e.g., in U.S. Pat. No. 7,478,019 by Zangooie et al, entitled "Multiple tool and structure analysis", which patent is incorporated herein by reference in its entirety for all purposes.

The illumination system of certain hardware configurations may include one or more light sources. The one or more light sources may generate light having only one wavelength (e.g., monochromatic light), light having a number of discrete wavelengths (e.g., polychromatic light), light having multiple wavelengths (e.g., broadband light), and/or light that sweeps through wavelengths, either continuously or hopping between wavelengths (e.g., tunable sources or swept sources). Examples of suitable light sources are: a white light source, an ultraviolet (UV) laser, an arc lamp or an electrode-less lamp, a laser sustained plasma (LSP) source, for example, those commercially available from Energetiq Technology, Inc. of Woburn, Mass., a supercontinuum source (such as a broadband laser source) such as those commercially available from NKT Photonics Inc. of Morganville, N.J., or shorter-wavelength sources such as x-ray sources, extreme UV sources, or some combination thereof. The light source(s) may also be configured to provide light having sufficient brightness, which in some cases may be a brightness greater than about 1 W/(nm cm2 Sr). The metrology system may also include a fast feedback to the light source for stabilizing its power and wavelength. Output of the light source can be delivered via free-space propagation, or in some cases delivered via optical fiber or light guide of any type.

In turn, one or more detectors or spectrometers are configured to receive via a collection optical elements illumination reflected or otherwise scattered from the surface of the specimen 4. Suitable sensors include charged coupled devices (CCD), CCD arrays, time delay integration (TDI) sensors, TDI sensor arrays, photomultiplier tubes (PMT), and other sensors. Measured spectra or detected signal data may be passed from each detector to the processor system 48 for analysis.

It should be recognized that the various steps described throughout the present disclosure may be carried out by a single processor system 48 or, alternatively, a multiple processor system 48. Moreover, different subsystems of the system of FIG. 13, such as the spectroscopic ellipsometer, may include a computer system suitable for carrying out at least a portion of the steps described herein. Therefore, the aforementioned description should not be interpreted as a limitation on the present invention but merely an illustration. Further, the one or more processor system 48 may be configured to perform any other step(s) of any of the method embodiments described herein.

In addition, the processor system 48 may be communicatively coupled to a detector system in any manner known in the art. For example, the one or more processor system 48 may be coupled to computing systems associated with the detector system. In another example, the detector system may be controlled directly by a single computer system coupled to processor system 48.

The processor system 48 of the metrology system may be configured to receive and/or acquire data or information from the subsystems of the system by a transmission medium that may include wireline and/or wireless portions. In this manner, the transmission medium may serve as a data link between the processor system 48 and other subsystems of the system of FIG. 13.

Processor system 48 of the integrated metrology system may be configured to receive and/or acquire data or information (e.g., measurement results, extracted features, transformed datasets, models, curve fittings, determined best focus or other process settings, relationships between best and actual focus, focus corrections, etc.) from other systems by a transmission medium that may include wireline and/or wireless portions. In this manner, the transmission medium may serve as a data link between the processor system 48 and other systems (e.g., memory on-board metrology system, external memory, reference measurement source, or other external systems). For example, processor system 48 may be configured to receive measurement data from a storage medium (e.g., internal or external memory) via a data link. For instance, spectral results obtained using the detection system may be stored in a permanent or semipermanent memory device (e.g., internal or external memory). In this regard, the spectral results may be imported from on-board memory or from an external memory system. Moreover, the processor system 48 may send data to other systems via a transmission medium. For instance, an optimum focus or focus correction determined by processor system 48 may be communicated and stored in an external memory. In this regard, measurement results may be exported to another system.

Processor system 48 may include, but is not limited to, a personal computer system, mainframe computer system, workstation, image computer, parallel processor, or any other device known in the art. In general, the term "processor system" may be broadly defined to encompass any device having one or more processors, which execute instructions from a memory medium. Program instructions implementing methods such as those described herein may be transmitted over a transmission medium such as a wire, cable, or wireless transmission link. Program instructions may be stored in a computer readable medium (e.g., memory). Exemplary computer-readable media include read-only memory, a random access memory, a magnetic or optical disk, or a magnetic tape.

The metrology tool may be designed to make many different types of measurements related to semiconductor manufacturing. Certain embodiments of the invention for determining optimal focus or other POI values may utilize such measurements. Additional metrology techniques for determining specific target characteristics may also be combined with the above-described focus determination techniques. For example, in certain embodiments the tool may measure spectra and determine characteristics of one or more targets, such as critical dimensions, overlay, sidewall angles, film thicknesses, process-related parameters (e.g., focus and/or dose). The targets can include certain regions of interest that are periodic in nature, such as for example gratings in a memory die. Targets can include multiple layers (or films) whose thicknesses can be measured by the metrology tool. Targets can include target designs placed (or already existing) on the semiconductor wafer for use, e.g., with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools as described in U.S. Pat. No. 7,478,019. The data from such measurements may be combined. Data from the metrology tool may be used in the semiconductor manufacturing process, for example, to feed-forward, feed-backward and/or feed-sideways corrections to the process (e.g. lithography, etch) and therefore, might yield a complete process control solution.

As semiconductor device pattern dimensions continue to shrink, smaller metrology targets are often required. Furthermore, the measurement accuracy and matching to actual device characteristics increase the need for device-like targets as well as in-die and even on-device measurements. Various metrology implementations have been proposed to achieve that goal. For example, focused beam ellipsometry based on primarily reflective optics is one of them and described in the patent by Piwonka-Corle et al. (U.S. Pat. No. 5,608,526, "Focused beam spectroscopic ellipsometry method and system"). Apodizers can be used to mitigate the effects of optical diffraction causing the spread of the illumination spot beyond the size defined by geometric optics. The use of apodizers is described in the patent by Norton, U.S. Pat. No. 5,859,424, "Apodizing filter system useful for reducing spot size in optical measurements and other applications". The use of high-numerical-aperture tools with simultaneous multiple angle-of-incidence illumination is another way to achieve small-target capability. This technique is described, e.g. in the patent by Opsal et al, U.S. Pat. No. 6,429,943, "Critical dimension analysis with simultaneous multiple angle of incidence measurements".

Other measurement examples may include measuring the composition of one or more layers of the semiconductor stack, measuring certain defects on (or within) the wafer, and measuring the amount of photolithographic radiation exposed to the wafer. In some cases, metrology tool and algorithm may be configured for measuring non-periodic targets, see e.g. "The Finite Element Method for Full Wave Electromagnetic Simulations in CD Metrology Using Scatterometry" by P. Jiang et al (U.S. 61/830,536, K-T disclosure P4063) or "Method of electromagnetic modeling of finite structures and finite illumination for metrology and inspection" by A. Kuznetsov et al. (U.S. 61/761,146 or KT disclosure P4082).

Measurement of parameters of interest usually involves a number of algorithms. For example, optical interaction of the incident beam with the sample is modeled using EM (electro-magnetic) solver and uses such algorithms as RCWA, FEM, method of moments, surface integral method, volume integral method, FDTD, and others. The target of interest is usually modeled (parametrized) using a geometric engine, or in some cases, process modeling engine or a combination of both. The use of process modeling is described in "Method for integrated use of model-based metrology and a process model," by A. Kuznetsov et al. (U.S. 61/738,760, P4025). A geometric engine may be implemented, for example, in AcuShape software product of KLA-Tencor of Milpitas, Calif.

Collected data can be analyzed by a number of data fitting and optimization techniques an technologies including libraries, Fast-reduced-order models; regression; machine-learning algorithms such as neural networks, support-vector machines (SVM); dimensionality-reduction algorithms such as, e.g., PCA (principal component analysis), ICA (independent component analysis), LLE (local-linear embedding); sparse representation such as Fourier or wavelet transform; Kalman filter; algorithms to promote matching from same or different tool types, and others.

Collected data can also be analyzed by algorithms that do not include modeling, optimization and/or fitting e.g. provisional patent application 61/745,981, which is incorporated herein by reference.

Computational algorithms are usually optimized for metrology applications with one or more approaches being used such as design and implementation of computational hardware, parallelization, distribution of computation, loadbalancing, multi-service support, dynamic load optimization, etc. Different implementations of algorithms can be done in firmware, software, FPGA, programmable optics components, etc.

The data analysis and fitting steps may be used to pursue one of the following goals: measurement of CD, SWA, shape, stress, composition, films, bandgap, electrical properties, focus/dose, overlay, generating process parameters (e.g., resist state, partial pressure, temperature, focusing model), and/or any combination thereof; modeling and/or design of metrology systems; and modeling, design, and/or optimization of metrology targets.

Certain embodiments of the present invention presented here generally address the field of semiconductor metrology and process control, and are not limited to the hardware, algorithm/software implementations and architectures, and use cases summarized above.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A method of determining structure parameters for semiconductor structures, the method comprising:
from an metrology or inspection system, acquiring a plurality of signals from one or more targets located in each of a plurality of fields on a semiconductor test wafer, wherein the one or more targets in each field were fabricated with different values of one or more process parameters of a photolithography system, wherein the acquired signals contain information regarding a parameter of interest (POI) for a top structure and such information is affected by one or more underlayers formed below such top structure, wherein the acquired signals include different signal types that each correlate to varying degrees with changes in the POI for the top structure and/or the one or more process parameters;
generating a feature extraction model to extract a feature signal that is a weighted combination of the acquired signals from each field and generating the feature extraction model to eliminate from the feature signal the effect of the one or more underlayers on the information regarding the POI for the top structure so as to isolate in such feature signal the information for the POI for the top structure of such field, and wherein the feature extraction model is generated to extract a weighted combination of acquired signals that is most sensitive to changes between the different values of the POI for the top structure and the one or more process parameters for the plurality of fields
training a parameter model for determining a value of the POI for the top structure of each field based on the feature signal for each field and known POI's for the one or more targets of each field;
repeating the operation for acquiring a plurality of signals from a plurality of targets on a production wafer, which differs from the test wafer, and extracting, in the same weighted combination as extracted by the feature extraction model, a plurality of second feature signals from the signals acquired from the production wafer; and measuring a plurality of POI values for a plurality of top structures of the plurality of targets on the production wafer based on the trained parameter model and the second feature signals for the production wafer.

2. The method of claim 1, wherein generating the feature extraction model includes:
performing a dataset reduction technique on the acquired signals for the plurality of fields to produce transformed signals data that is most sensitive to variations between the different values of the one or more process parameters; and
generating the feature extraction model to extract the feature signal from the transformed signals data,
wherein the one or more process parameters include a focus parameter, and the method further comprising:
fitting a curve to the plurality of fields' feature signals as a function of focus; and
determining and using an extreme point in the curve as an optimal focus for configuring the focus parameter of the photolithography system for fabricating a plurality of wafers.

3. The method of claim 2, wherein the transformed signals data is a linear combination of the acquired signals.

4. The method of claim 2, wherein the dataset reduction technique is accomplished using a principal component analysis (PCA), kernel PCA (kPCA), non-linear PCA (NLPCA), Independent Component Analysis (ICA), or Local Linear Embedding (LLE) algorithm.

5. The method of claim 2, wherein the dataset reduction technique is accomplished using a principal component analysis (PCA) technique and the transformed signals data represent the acquired signals with respect to a first principal component resulting from the PCA technique.

6. The method of claim 1, wherein the acquired signals for the plurality of fields include a first set of acquired signals from one or more first targets in each field and a second set of acquired signals from one or more second targets in each field, wherein the one or more first targets have a top layer structure and an underlayer structure and the one or more second targets have the same underlayer structure as the one or more first targets but excludes the top layer structure of the one or more first targets, wherein generating the feature extraction model includes modelling for each field the first acquired signals as a function of the second acquired signals plus a residual signal and defining the residual signals determined for the first acquired signals as the feature signal for such each field.

7. The method of claim 1, wherein the acquired signals for the plurality of fields include a first set of acquired signals from one or more first targets in each field and a second set of acquired signals from one or more second targets in each field, wherein the one or more first targets have a top layer structure and an underlayer structure and the one or more second targets have the same top layer structure as the one or more first targets but a different underlayer than the one or more first targets, wherein generating the feature extraction model includes modelling each of the first acquired signals as a function of the second acquired signals plus a residual signal and defining the function of the second acquired signals determined for the first acquired signals as the feature signal for such each field.

8. The method of claim 1, wherein the acquired signals for the plurality of fields include a first set of acquired signals at a first azimuth angle from a particular target in each field and a second set of acquired signals at a second azimuth angle from the particular target in each field, wherein the particular target has an unpatterned underlayer portion over which the top structure is formed, wherein the first azimuth angle differs from the second azimuth angle, wherein generating the feature extraction model includes modelling each of the first acquired signals as a function of the second acquired signals plus a residual signal and defining the residual signals determined for the first acquired signals as the feature signal for such each field.

9. The method of claim 8, wherein the first azimuth angle is zero and the second azimuth angle is 90°.

10. The method of claim 1, wherein the acquired signals for the plurality of fields include a plurality of two-dimensional beam profile reflectometry (2DBPR) images from a particular target in each field, wherein the particular target has an unpatterned underlayer over which the top structure is formed, wherein the feature extraction model is a radial symmetric function that fits each 2DBPR image with a residual signal, the residual signals determined for the images being defined as the feature signal for such each field.

11. The method of claim 1, wherein the signals are acquired using one or more of the following: spectroscopic ellipsometry, Mueller matrix spectroscopic ellipsometry, spectroscopic reflectometry, spectroscopic scatterometry, beam profile reflectometry, beam profile ellipsometry, a single wavelength, a single discrete wavelength range, or multiple discrete wavelength ranges.

12. A system for inspecting or measuring a specimen, comprising:
an illuminator for generating a radiation beam;
illumination optics for directing the radiation beam towards one or more targets located in a plurality of fields on a semiconductor test wafer, wherein the one or more targets in each field were fabricated with different values of one or more process parameters of a photolithography system;
collection optics for directing a plurality of acquired signals from the one or more targets located in each of the plurality of fields in response to the radiation beam to a detector system, wherein the acquired signals contain information regarding a parameter of interest (POI) for a top structure and such information is affected by one or more underlayers formed below such top structure, wherein the acquired signals include different signal types that each correlate to varying degrees with changes in the POI for the top structure and/or the one or more process parameters;
the detector system for acquiring the plurality of signals from the one or more targets from each of the plurality of fields in response to the illumination; and
a processor and memory configured for performing the following operations:
generating a feature extraction model to extract a feature signal that is a weighted combination of the acquired signals from each field and generating the feature extraction model to eliminate from the feature signal the effect of the one or more underlayers on the information regarding the POI for the top structure so as to isolate in such feature signal the information for the POI for the top structure of such field, and wherein the feature extraction model is generated to extract a weighted combination of acquired signals that is most sensitive to changes between the different values of the POI for the top structure and the one or more process parameters for the plurality of fields;
training a parameter model for determining a value of the POI for the top structure of each field based on the feature signal for each field and known POI's for the one or more targets of each field;
repeating the operation for acquiring a plurality of signals from a plurality of targets on a production wafer, which differs from the test wafer, and extracting, in the same weighted combination as extracted by the feature extraction model, a plurality of second feature signals from the signals acquired from the production wafer; and
measuring a plurality of POI values for a plurality of top structures of the plurality of targets on the production wafer based on the trained parameter model and the second feature signals for the production wafer.

13. The system of claim 12, wherein generating the feature extraction model includes:
performing a dataset reduction technique on the acquired signals for the plurality of fields to produce transformed signals data that is most sensitive to variations between the different values of the one or more process parameters; and
generating the feature extraction model to extract the feature signal from the transformed signals data,
wherein the one or more process parameters include a focus parameter, and the method further comprising:
fitting a curve to the plurality of fields' feature signals as a function of focus; and
determining and using an extreme point in the curve as an optimal focus for configuring the focus parameter of the photolithography system for fabricating a plurality of wafers.

14. The system of claim 13, wherein the transformed signals data is a linear combination of the acquired signals.

15. The system of claim 13, wherein the dataset reduction technique is accomplished using a principal component analysis (PCA), kernel PCA (kPCA), non-linear PCA (NLPCA), Independent Component Analysis (ICA), or Local Linear Embedding (LLE) algorithm.

16. The system of claim 13, wherein the dataset reduction technique is accomplished using a principal component analysis (PCA) technique and the transformed signals data represent the acquired signals with respect to a first principal component resulting from the PCA technique.

17. The system of claim 12, wherein the acquired signals for the plurality of fields include a first set of acquired signals from one or more first targets in each field and a second set of acquired signals from one or more second targets in each field, wherein the one or more first targets have a top layer structure and an underlayer structure and the one or more second targets have the same underlayer structure as the one or more first targets but excludes the top layer structure of the one or more first targets, wherein generating the feature extraction model includes modelling each of the first acquired signals as a function of the second acquired signals plus a residual signal and defining the residual signals determined for the first acquired signals as the feature signal for such each field.

18. The system of claim 12, wherein the acquired signals for the plurality of fields include a first set of acquired signals from one or more first targets in each field and a second set of acquired signals from one or more second targets in each field, wherein the one or more first targets have a top layer structure and an underlayer structure and the one or more second targets have the same top layer structure as the one or more first targets but a different underlayer than the one or more first targets, wherein generating the feature extraction model includes modelling each of the first acquired signals as a function of the second acquired signals plus a residual signal and defining the function of the second acquired signals determined for the first acquired signals as the feature signal for such each field.

19. The system of claim 12, wherein the acquired signals for the plurality of fields include a first set of acquired signals at a first azimuth angle from a particular target in each field and a second set of acquired signals at a second azimuth angle from the particular target in each field, wherein the particular target has an unpatterned underlayer portion over which the top structure is formed, wherein the first azimuth angle differs from the second azimuth angle, wherein generating the feature extraction model includes modelling each of the first acquired signals as a function of the second acquired signals plus a residual signal and defining the residual signals determined for the first acquired signals as the feature signal for such each field.

20. The system of claim 19, wherein the first azimuth angle is zero and the second azimuth angle is 90°.

21. The system of claim 12, wherein the acquired signals for the plurality of fields include a plurality of two-dimensional beam profile reflectometry (2DBPR) images from a particular target in each field, wherein the particular target has an unpatterned underlayer over which the top structure is formed, wherein the feature extraction model is a radial symmetric function that fits each 2DBPR image with a residual signal, the residual signals determined for the images being defined as the feature signal for such each field.

22. The system of claim 12, wherein the signals are acquired using one or more of the following: spectroscopic ellipsometry, Mueller matrix spectroscopic ellipsometry, spectroscopic reflectometry, spectroscopic scatterometry, beam profile reflectometry, beam profile ellipsometry, a single wavelength, a single discrete wavelength range, or multiple discrete wavelength ranges.

* * * * *